United States Patent  
Nishiyama et al.

(10) Patent No.: US 8,999,832 B2  
(45) Date of Patent: Apr. 7, 2015

(54) ORGANIC EL ELEMENT

(71) Applicant: Panasonic Corporation, Osaka (JP)

(72) Inventors: Seiji Nishiyama, Osaka (JP); Satoru Ohuchi, Osaka (JP); Takahiro Komatsu, Osaka (JP); Kei Sakanoue, Fukuoka (JP); Yoshiaki Tsukamoto, Osaka (JP); Shinya Fujimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/739,363

(22) Filed: Jan. 11, 2013

(65) Prior Publication Data

US 2013/0126841 A1    May 23, 2013

Related U.S. Application Data

(63) Continuation of application No. PCT/JP2010/004987, filed on Aug. 6, 2010.

(51) Int. Cl.  
H01L 33/60 (2010.01)  
H01L 51/50 (2006.01)  
(Continued)

(52) U.S. Cl.  
CPC ........ H01L 51/5088 (2013.01); H01L 51/5209 (2013.01); H01L 51/5218 (2013.01); H01L 51/56 (2013.01); H01L 2251/5369 (2013.01)

(58) Field of Classification Search  
CPC ............ H01L 27/3246; H01L 51/5088; H01L 2251/562  
USPC ................ 257/88, 40, 369, 296; 438/29, 592; 313/504, 506  
See application file for complete search history.

(56) References Cited

U.S. PATENT DOCUMENTS 5,294,869 A    3/1994    Tang et al.  
5,443,922 A    8/1995    Nishizaki et al.  
(Continued)

FOREIGN PATENT DOCUMENTS

CN    101170124    4/2008  
DE    102005007540    8/2006  
(Continued)

OTHER PUBLICATIONS

United States Office Action in U.S. Appl. No. 13/205,773, dated Mar. 6, 2013.

(Continued)

Primary Examiner — Kenneth Parker  
Assistant Examiner — Bo Fan  
(74) Attorney, Agent, or Firm — Greenblum & Bernstein, P.L.C.

(57) ABSTRACT

An organic electroluminescent (EL) element comprises: an anode; a cathode; a functional layer disposed between the anode and the cathode, and including a light-emitting layer containing an organic material; a hole injection layer disposed between the anode and the functional layer; and a bank that defines an area in which the light-emitting layer is to be formed, wherein the hole injection layer includes tungsten oxide and includes an occupied energy level that is approximately 1.8 electron volts to approximately 3.6 electron volts lower than a lowest energy level of a valence band of the hole injection layer in terms of a binding energy, the hole injection layer has a recess in an upper surface of the area defined by the bank, and an upper peripheral edge of the recess is covered with a part of the bank.

20 Claims, 27 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 5,688,551 A | 11/1997 | Littman et al. | |
| 6,132,280 A | 10/2000 | Tanabe et al. | |
| 6,284,393 B1 | 9/2001 | Hosokawa et al. | |
| 6,309,801 B1 | 10/2001 | Meijer et al. | |
| 7,785,718 B2 | 8/2010 | Yatsunami et al. | |
| 8,058,797 B2 | 11/2011 | Frey et al. | |
| 2002/0051894 A1 | 5/2002 | Yoshikawa | |
| 2002/0158835 A1 | 10/2002 | Kobayashi et al. | |
| 2003/0137242 A1 | 7/2003 | Seki | |
| 2004/0075385 A1 | 4/2004 | Tao | |
| 2004/0178414 A1 | 9/2004 | Frey et al. | |
| 2005/0064633 A1 | 3/2005 | Mikoshiba | |
| 2005/0093432 A1 | 5/2005 | Yamazaki et al. | |
| 2005/0093434 A1 | 5/2005 | Suh et al. | |
| 2005/0170208 A1 | 8/2005 | Yatsunami et al. | |
| 2005/0208206 A1 | 9/2005 | Yoshikawa | |
| 2005/0266763 A1 | 12/2005 | Kimura et al. | |
| 2006/0008931 A1 | 1/2006 | Lee et al. | |
| 2006/0139342 A1 | 6/2006 | Yu | |
| 2006/0204788 A1 | 9/2006 | Yoshikawa | |
| 2006/0243377 A1 | 11/2006 | Matsuo et al. | |
| 2006/0284166 A1 | 12/2006 | Chua et al. | |
| 2007/0029929 A1 | 2/2007 | Nakamura et al. | |
| 2007/0034864 A1 | 2/2007 | Liu | |
| 2007/0099396 A1 | 5/2007 | Hirai et al. | |
| 2007/0172978 A1 | 7/2007 | Chua et al. | |
| 2007/0241665 A1 | 10/2007 | Sakanoue et al. | |
| 2007/0290604 A1 | 12/2007 | Sakanoue et al. | |
| 2008/0100209 A1 | 5/2008 | Ito | |
| 2008/0150422 A1 | 6/2008 | Ohara | |
| 2008/0231179 A1 | 9/2008 | Abe et al. | |
| 2008/0312437 A1* | 12/2008 | Inoue et al. | 544/225 |
| 2009/0008643 A1 | 1/2009 | Yamazaki et al. | |
| 2009/0058268 A1 | 3/2009 | Yoshida et al. | |
| 2009/0096364 A1 | 4/2009 | Fujii et al. | |
| 2009/0115318 A1 | 5/2009 | Gregory et al. | |
| 2009/0160325 A1 | 6/2009 | Yatsunami et al. | |
| 2009/0200917 A1 | 8/2009 | Yamagata et al. | |
| 2009/0206422 A1 | 8/2009 | Illing et al. | |
| 2009/0224664 A1 | 9/2009 | Yoshida et al. | |
| 2009/0243478 A1 | 10/2009 | Shoda et al. | |
| 2009/0250685 A1* | 10/2009 | Moon | 257/13 |
| 2009/0272999 A1 | 11/2009 | Yoshida et al. | |
| 2009/0284135 A1 | 11/2009 | Yoshida et al. | |
| 2009/0284141 A1 | 11/2009 | Sakanoue et al. | |
| 2009/0284144 A1 | 11/2009 | Fujioka et al. | |
| 2009/0284146 A1 | 11/2009 | Yoshida et al. | |
| 2009/0315027 A1 | 12/2009 | Kidu et al. | |
| 2010/0084672 A1 | 4/2010 | Ueno et al. | |
| 2010/0102310 A1 | 4/2010 | Komatsu et al. | |
| 2010/0181554 A1 | 7/2010 | Yoshida et al. | |
| 2010/0181559 A1* | 7/2010 | Nakatani et al. | 257/40 |
| 2010/0188376 A1 | 7/2010 | Sagawa et al. | |
| 2010/0213827 A1 | 8/2010 | Yoshida et al. | |
| 2010/0252857 A1 | 10/2010 | Nakatani et al. | |
| 2010/0258833 A1 | 10/2010 | Okumoto et al. | |
| 2010/0302221 A1 | 12/2010 | Okumoto | |
| 2011/0018007 A1 | 1/2011 | Kasahara et al. | |
| 2011/0037065 A1 | 2/2011 | Ueno et al. | |
| 2011/0037068 A1 | 2/2011 | Yamazaki et al. | |
| 2011/0042703 A1 | 2/2011 | Okumoto et al. | |
| 2011/0140091 A1* | 6/2011 | Friend et al. | 257/40 |
| 2011/0140596 A1 | 6/2011 | Yoshida et al. | |
| 2011/0180821 A1 | 7/2011 | Matsushima | |
| 2011/0193107 A1 | 8/2011 | Takeuchi et al. | |
| 2011/0198623 A1 | 8/2011 | Matsushima | |
| 2011/0198624 A1 | 8/2011 | Matsushima | |
| 2011/0204410 A1 | 8/2011 | Yada | |
| 2012/0061656 A1 | 3/2012 | Ohuchi et al. | |
| 2012/0132934 A1 | 5/2012 | Ohuchi et al. | |
| 2012/0132935 A1 | 5/2012 | Isobe et al. | |
| 2012/0178191 A1 | 7/2012 | Sakanoue et al. | |

FOREIGN PATENT DOCUMENTS

| | | |
|---|---|---|
| EP | 2175504 | 4/2010 |
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2007/037358 | 4/2007 |
| WO | 2008/120714 A1 | 10/2008 |
| WO | 2008/149498 A1 | 12/2008 |

(56) References Cited

FOREIGN PATENT DOCUMENTS

| WO | 2008/149499 A1 | 12/2008 |
|---|---|---|
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

United States Office Action in U.S. Appl. No. 13/298,528, dated Jan. 11, 2013.
Meyer et al., "Charge generation layers comprising transition metal-oxide/organic interfaces: Electronic structure and charge generation mechanism", Applied Physics Letters, 96, 193302, pp. 1-3 (May 2010).
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/AL2O3 Supported Oxide System from X-Ray Abortion Near-edge Spectroscopy and Raman Spectroscopy", Journal of Physical Chemistry, 91, pp. 4014-4020 (1987).
United States Office Action in U.S. Appl. No. 13/742,593, dated Apr. 3, 2014.
United States Office Action in U.S. Appl. No. 13/746,485, dated Apr. 25, 2014.
United States Office Action in U.S. Appl. No. 13/746,481, dated Apr. 29, 2014.
United States Office Action in U.S. Appl. No. 13/740,348, dated Apr. 29, 2014.
United States Office Action in U.S. Appl. No. 13/298,528, dated May 17, 2013.
Japan Office Action in Japanese Patent Application No. 2009-189658, dated Apr. 8, 2013.
STELLA Tsuushin (STELLA communication), Stella Corporation, undated, available at http://www.stellacorp.co.jp/media/conference#past/0902sorst.html, accessed on Apr. 8, 2013, together with a partial English language translation.
L. Chkoda et al., "Work function of ITO substrates and band-offsets at the TPD/ITO interface determined by photoelectron spectroscopy", Synthetic metals 111-112, pp. 315-319 (2000).
U.S. Appl. No. 13/994,164 to Satoru Ohuchi et al., filed Jun. 14, 2013.
U.S. Appl. No. 13/995,205 to Takahiro Komatsu et al., filed Jun. 18, 2013.
China Office Action from State Intellectual Property Office (SIPO) in Chinese Patent Application No. 201080019186.5, dated Apr. 3, 2014, together with a partial English language translation.
Dinesh Kabra et al., "High Efficiency Composite Metal Oxide-Polymer Electroluminescent Devices: A Morphological and Material Based Investigation", Advanced Materials, vol. 20, Issue 18, pp. 3447-3452 (2008).
United States Office Action in U.S. Appl. No. 13/298,528, dated Jan. 14, 2014.
United States Office Action in U.S. Appl. No. 13/994,164, dated Jun. 5, 2014.
United States Notice of Allowance in U.S. Appl. No. 13/995,205, dated May 13, 2014.
Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).
United States Office Action in U.S. Appl. No. 13/205,773, dated Aug. 16, 2013.
United States Office Action in U.S. Appl. No. 13/205,773, dated Jan. 10, 2013.
Extended European Search Report (EESR) in European Patent Application No. 10741076.3, dated Feb. 25, 2013.
United States Advisory Action in U.S. Appl. No. 13/205,773, dated Jan. 15, 2014.
United States Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/298,528 to Satoru Ohuchi et al., filed Nov. 27, 2011.
U.S. Appl. No. 13/736,285 to Seiji Nishiyama et al., filed Jan. 8, 2013.
U.S. Appl. No. 13/740,348 to Seiji Nishiyama et al., filed Jan. 14, 2013.
U.S. Appl. No. 13/740,353 to Seiji Nishiyama, filed Jan. 14, 2013.
U.S. Appl. No. 13/739,290 to Seiji Nishiyama, filed Jan. 11, 2013.
U.S. Appl. No. 13/746,481 to Seiji Nishiyama, filed Jan. 22, 2013.
U.S. Appl. No. 13/746,485 to Kenji Harada et al., filed Jan. 22, 2013.
U.S. Appl. No. 13/742,593 to Kenji Harada et al., filed Jan. 16, 2013.
International Search Report in PCT/JP2010/000782, dated Apr. 6, 2010.

(56) References Cited

OTHER PUBLICATIONS

International Search Report in PCT/JP2010/004471, dated Oct. 5, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.
International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.
International Search Report in PCT/JP2010/004993, dated Sep. 7, 2010.
International Search Report in PCT/JP2010/004989, dated Sep. 7, 2010.
International Search Report in PCT/JP2011/000324, dated Feb. 22, 2011.
International Search Report in PCT/JP2012/000288, dated Apr. 17, 2012.
United States Restriction Requirement in U.S. Appl. No. 13/740,353, dated Sep. 22, 2014.
United States Notice of Allowance in U.S. Appl. No. 13/746,481, dated Sep. 24, 2014.
United States Office Action in U.S. Appl. No. 13/205,773, dated Jul. 17, 2014.
United States Office Action in U.S. Appl. No. 13/746,485, dated Aug. 4, 2014.
United States Office Action in U.S. Appl. No. 13/742,593, dated Aug. 6, 2014.
China Office Action from State Intellectual Property Office (SIPO) in Chinese Patent Application No. 201080004030.X, dated Aug. 26, 2013, together with a partial English language translation.

* cited by examiner

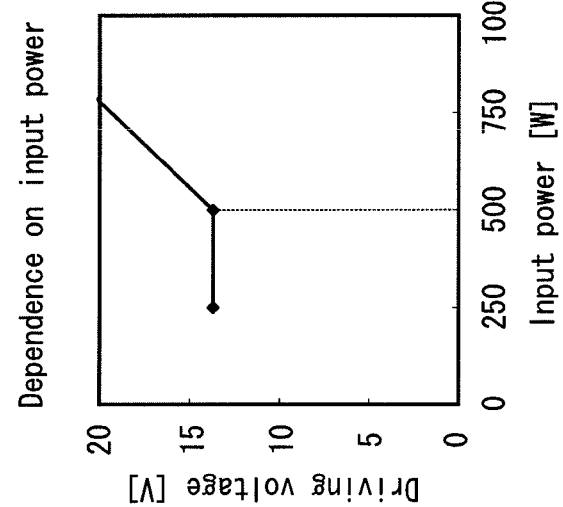
FIG. 3A Dependence on total pressure
Oxygen partial pressure = 50%
Input power = 500 W
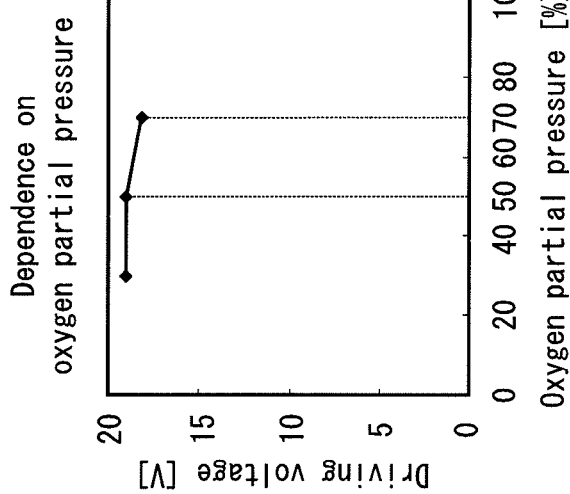
FIG. 3B Dependence on oxygen partial pressure
Total pressure = 2.7 Pa
Input power = 500 W
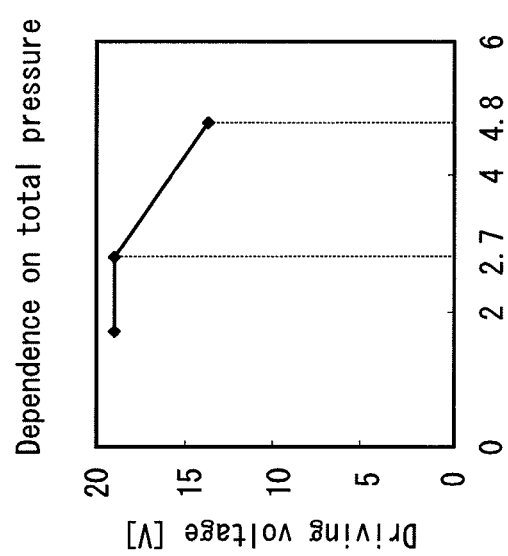
FIG. 3C Dependence on input power
Total pressure = 4.8 Pa
Oxygen partial pressure = 50%

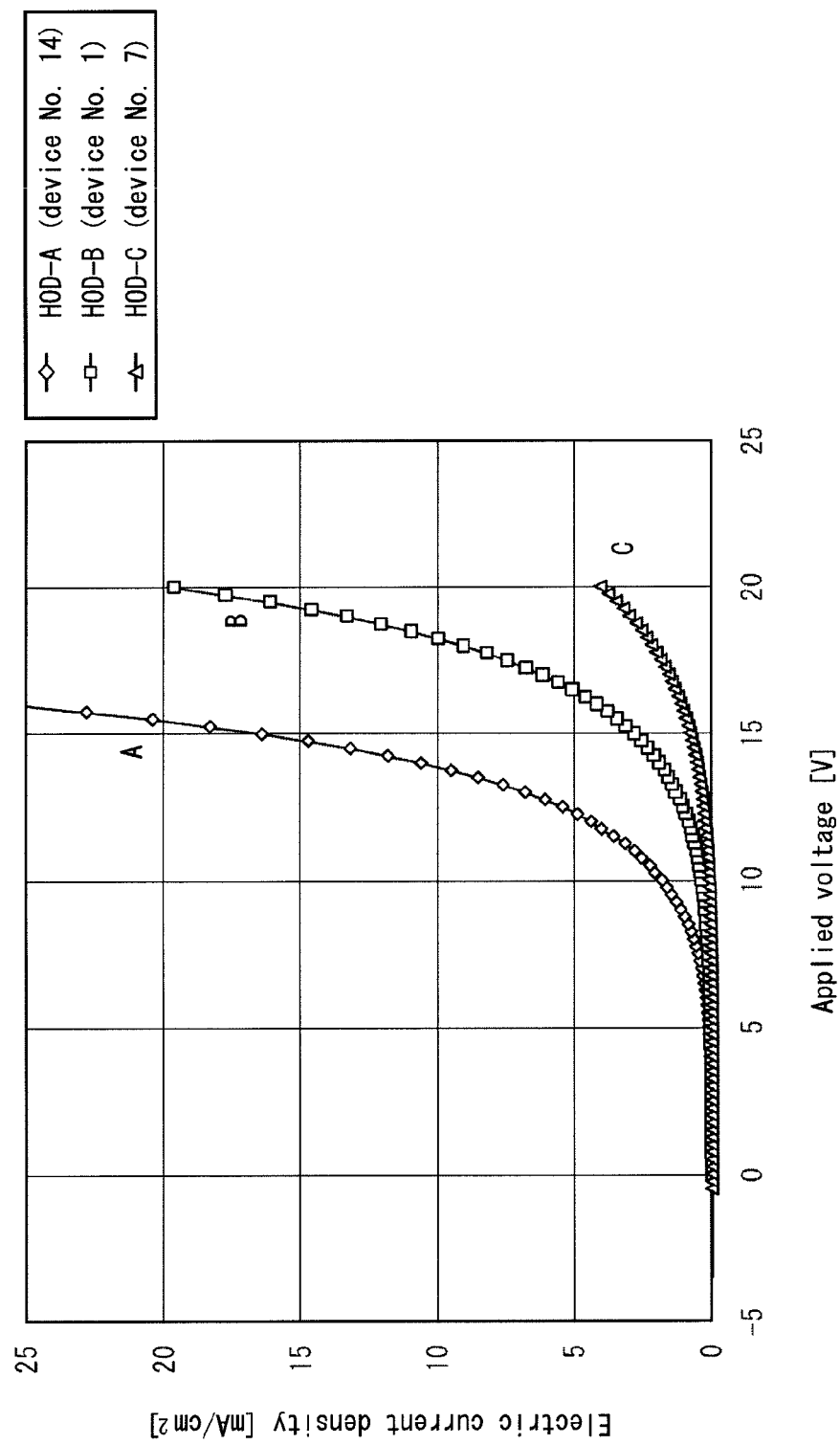

(A: a case where an appropriate number of injection sites exists in the tungsten oxide layer)

(B, C: a case where there are no injection sites in the tungsten oxide layer and a case where there is a shortage of injection sites in the tungsten oxide layer)

ORGANIC EL ELEMENT

CROSS REFERENCE TO RELATED APPLICATION

This is a continuation application of PCT Application No. PCT/JP2010/004987 filed Aug. 6, 2010, designating the United States of America, the disclosure of which, including the specification, drawings and claims, is incorporated herein by reference in its entirety.

TECHNICAL FIELD

The present invention relates to an organic electric-field light-emitting element (referred to hereinafter as an "organic EL element"), which is an electric light-emitting element. Particularly, the present invention relates to a technology for driving such an organic EL element at low electricity while ensuring a wide range of luminous intensity from low luminous intensity to high luminous intensity for the use as a light source or the like.

DESCRIPTION OF THE RELATED ART

In recent years, progress is being made in research and development of diverse functional elements which involve the use of an organic semiconductor.

Organic EL elements are known as being one of the most common among such functional elements. An organic EL element is a current-driven light-emitting element, and commonly includes a pair of electrodes consisting of an anode and a cathode, and a functional layer containing organic material disposed between the pair of electrodes. The functional layer includes layers such as a light-emitting layer and a buffer layer. Further, there are cases where a hole injection layer is disposed between the functional layer and the anode. The hole injection layer is disposed for injecting holes to the functional layer. When driving the organic EL element, voltage is applied between the pair of electrodes. The emission of light from the organic EL element is caused by an electric-field light-emitting phenomenon taking place as a result of the recombination of holes which are injected from the anode to the functional layer, and the electrons which are injected from the cathode to the functional layer. Now, more attention is being given to the application of organic EL elements as a light-emitting element or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the functional layer therein. The first type of organic EL elements is a vapor deposition type. A vapor deposition-type organic EL element has a functional layer that is mainly composed of low molecular material and that is formed as a film by applying a vacuum process such as a vapor deposition method. The second type of organic EL elements is an application type. An application-type organic EL element has a functional layer that is mainly composed of either high molecular material, or low molecular material having an excellent thin film forming property, and that is formed as a film by applying a wet process such as an inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (for instance, refer to Patent Literatures 1 and 2). As a result, vapor deposition-type organic EL elements have already been put into practical use in mobile phone displays, small-sized TVs and the like.

However, although vapor deposition-type organic EL elements may be ideal for use in small-sized organic EL panels, application thereof is extremely difficult, for example, to full-color, large-sized organic EL panels having display sizes of around 100 inches. The difficulty of such an application derives from the technology applied in the manufacturing of a vapor deposition-type organic EL element. For instance, when manufacturing an organic EL panel using vapor deposition-type organic EL elements, a mask vapor deposition method is commonly applied for separately forming light-emitting layers corresponding to each of the colors (for instance R, G, and B) to be displayed on the organic EL panel. However, as the surface area of the organic EL panel to be manufactured becomes larger, it becomes more and more difficult to maintain the precision with which mask position adjustment is performed. This is due to reasons such as the difference in thermal expansion coefficients between the mask and the glass substrate. Hence, the manufacturing of a large-sized display without any deficiencies is extremely difficult when applying vapor deposition-type organic EL elements. One possible countermeasure as to overcome such a problem is using vapor deposition-type organic EL elements having a light-emitting layer formed of white-colored material, and further providing color filters of the respective colors R, G, and B. This excludes the need for the separate application of colors, but however, such a countermeasure has a shortcoming as well. In specific, when taking such a countermeasure, the amount of light which can be actually used is a mere third of the amount of light emitted from the entire light-emitting layer, and thus, more electricity will be consumed, in principle.

As such, attempts are being made to realize the manufacturing of larger organic EL panels by using application-type organic EL elements. As already described in the above, a functional layer is formed by applying a wet process in an application-type organic EL element. In the application of the wet process, the precision with which the application of functional layer material of the respective colors to corresponding positions on the substrate is performed is not influenced by the size of the substrate. Hence, the technical barrier to be overcome in realizing the manufacturing of larger organic EL panels is not as high as in the case of vapor deposition-type organic EL elements.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low electrical consumption. Generally, provision of an injection layer in between each of the electrodes and the functional layer is effective in realizing efficient injection of carriers to the functional layer. This is since an injection layer has the function of lowering the energy barrier to be overcome in the injection of carriers. As a hole injection layer, which is one of the injection layers, such films as a vapor deposition film and an application film are commonly used. A vapor deposition film is composed of material such as copper phthalocyanine and molybdenum oxide, whereas an application film is composed of PEDOT or the like. Among such hole injection layers, it has been reported that a vapor deposition film composed of molybdenum oxide contributes to the improvement of hole injection efficiency, as well as to the longevity of the organic EL element (for instance, refer to Patent Literature 3).

CITATION LIST

Patent Literature

[Patent Literature 1]
Japanese Patent Publication No. 3369615.
[Patent Literature 2]
Japanese Patent Publication No. 3789991.
[Patent Literature 3]
Japanese Patent Application Publication No. 2005-203339.

Non-Patent Literature

[Non-Patent Literature 1]
Jingze Li et al., Synthetic Metals 151, 141 (2005).
[Non-Patent Literature 2]
Hiromi Watanabe et al., Yuki EL Tohronkai Dai 7 Kai Reikai Yokoushuu, 17 (2008).
[Non-Patent Literature 3]
Hyunbok Lee et al., Applied Physics Letters 93, 043308 (2008).
[Non-Patent Literature 4]
Kenji Koizumi et al., Dai 56 Kai Ouyou Butsurigaku Kankei Rengou Kouenkai Yokoushuu, 30p-ZA-11 (2009).
[Non-Patent Literature 5]
Yasuo Nakayama et al., Yuki EL Tohronkai Dai 7 Kai Reikai Yokoushuu, 5 (2008).

SUMMARY

However, application-type organic EL elements having such advantages as described above are required to be driven at a lower voltage and achieve more excellent luminous efficiency. In particular, in manufacturing process of application-type organic EL elements, more improvements of hole injection efficiency and longevity of the organic EL element are required.

In view of such problems, the present invention provides an organic EL element which has a reduced hole injection barrier between the hole injection layer and the functional layer, and which exhibits excellent hole injection efficiency. As such, the organic EL element pertaining to the present invention is expected to drive in excellent state under low voltage.

In order to solve the above-presented problems, one aspect of the present invention is an organic electroluminescent (EL) element, comprising: an anode; a cathode; a functional layer disposed between the anode and the cathode, and including a light-emitting layer containing an organic material; a hole injection layer disposed between the anode and the functional layer; and a bank that defines an area in which the light-emitting layer is to be formed, wherein the hole injection layer includes tungsten oxide and includes an occupied energy level that is approximately 1.8 electron volts to approximately 3.6 electron volts lower than a lowest energy level of a valence band of the hole injection layer in terms of a binding energy, the hole injection layer has a recess in an upper surface of the area defined by the bank, and an upper peripheral edge of the recess is covered with a part of the bank.

One aspect of the present invention is an organic EL element having a hole injection layer which contains tungsten oxide. Further, the hole injection layer has, in an electronic state thereof, an occupied energy level which is 1.8 eV to 3.6 eV lower than the lowest energy level of a valence band of the hole injection layer, in terms of binding energy. By the hole injection layer having such an occupied energy level, the hole injection barrier between the hole injection layer and the functional layer is suppressed to a low level. Resultantly, the organic EL element which is one aspect of the present invention has excellent hole injection efficiency, can be driven at a low voltage, and is expected to exhibit excellent light-emitting efficiency.

Meanwhile, when the hole injection layer containing tungsten oxide has the above-described occupied energy level, there occurs a particular and new problem. In specific, in manufacturing process of the hole injection layer, film thickness thereof decreases (hereinafter, this fact is referred to also as film loss). This might affect light-emitting characteristics, causing problems such as causing the unevenness in luminance of a light-emitting surface in an area defined by banks or a decrease in service life of the organic EL element.

In contrast, according to the organic EL element which is one aspect described above of the present invention, part of the surface of the hole injection layer facing the functional layers has a concave structure. That is, the part of the surface is closer to the anode than the remaining portion of the surface is. Further, edge of the concave structure of the hole injection layer is covered with part of banks, which can reduce concentration of the electric field occurring at the edge. This prevents problems such as the unevenness in luminance or a decrease in service life of the organic EL element. That is, it is possible to prevent the occurrence of effects on light-emitting characteristics.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 3A through 3C are graphs illustrating a dependence of driving voltage of hole-only devices on film forming conditions of a hole injection layer.

FIG. 4 is a device characteristics diagram showing a relation curve illustrating a relation between applied voltage and electric current density of the hole-only devices.

DETAILED DESCRIPTION

Figure 1:
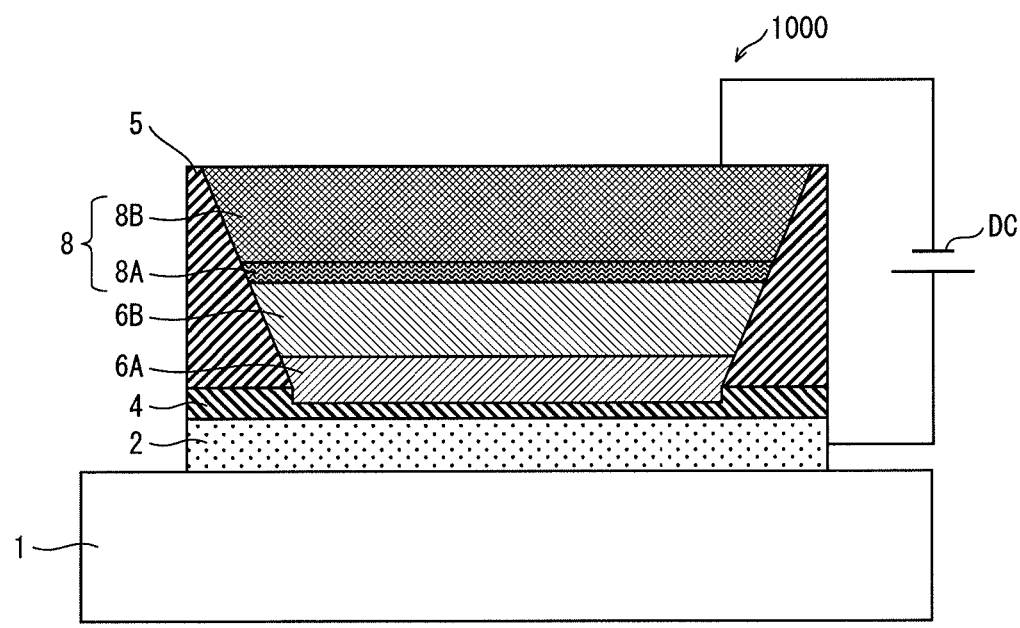
FIG. 1 is a schematic cross-sectional view illustrating a structure of an organic EL element pertaining to Embodiment 1.

One aspect of the present invention is an organic electroluminescent (EL) element, comprising: an anode; a cathode; a functional layer disposed between the anode and the cathode, and including a light-emitting layer containing an organic material; a hole injection layer disposed between the anode and the functional layer; and a bank that defines an area in which the light-emitting layer is to be formed, wherein the hole injection layer includes tungsten oxide and includes an occupied energy level that is approximately 1.8 electron volts to approximately 3.6 electron volts lower than a lowest energy level of a valence band of the hole injection layer in terms of a binding energy, the hole injection layer has a recess in an upper surface of the area defined by the bank, and an upper peripheral edge of the recess is covered with a part of the bank.

In addition, as another aspect of the present invention, the occupied energy level at an interface between the hole injection layer and the functional layer may be approximately equal to an energy level of a highest occupied molecular orbital of the functional layer in terms of the binding energy.

Further in addition, as another aspect of the present invention, a gap between the occupied energy level at an interface between the hole injection layer and the functional layer and an energy level of a highest occupied molecular orbital of the functional layer may be at most approximately 0.3 electron volts in terms of the binding energy.

Also, as another aspect of the present invention, an ultraviolet photoelectron spectroscopy spectrum of the hole injection layer exhibits an upward protrusion that may be approximately 1.8 electron volts to approximately 3.6 electron volts lower than the lowest energy level of the valence band in terms of the binding energy. Similarly, an X-ray photoelectron spectroscopy spectrum of the hole injection layer exhibits an upward protrusion that may be approximately 1.8 electron volts to approximately 3.6 electron volts lower than the lowest energy level of the valence band in terms of the binding energy.

Here, as another aspect of the present invention, a differential spectrum obtained by differentiating an ultraviolet photoelectron spectroscopy spectrum of the hole injection layer may have a shape that is expressed by a non-exponential function throughout a range between approximately 2.0 electron volts and approximately 3.2 electron volts lower than the lowest energy level of the valence band in terms of the binding energy.

Additionally, as another aspect of the present invention, the functional layer may comprise an amine-containing material.

Further in addition, as another aspect of the present invention, the functional layer may include at least one of a hole transfer layer that transfers the holes, and a buffer layer that one of adjusts optical characteristics of the organic light-emitting element and blocks electrons.

Also, as another aspect of the present invention, the occupied energy level may be approximately 2.0 electron volts to 3.2 electron volts lower than the lowest energy level of the valence band in terms of the binding energy.

As another aspect of the present invention, the part of the bank may reach a bottom of the recess, and a side surface of the bank may slope upward from the bottom of the recess to a top of the bank.

As another aspect of the present invention, the part of the bank may be out of contact with a bottom of the recess.

As another aspect of the present invention, the hole injection layer may extend laterally along a bottom surface of the bank.

As another aspect of the present invention, the upper peripheral edge of the recess may comprise a convex portion composed of (i) a part of the upper surface of the hole injection layer in which the recess is not formed and (ii) the inner side surface of the recess.

As another aspect of the present invention, the bank may be liquid-repellent and the hole injection layer is liquid-philic.

Another aspect of the present invention may be a display device comprising the above organic EL element.

As another aspect of the present invention, a manufacturing method for an organic EL element, comprises: preparing an anode; forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$; forming a bank material layer containing material constituting a bank above the tungsten oxide layer; forming a recess by removing a portion of the bank material layer so that the tungsten oxide layer is partially exposed and an upper surface of the tungsten oxide layer in the recess is closer to the anode than an upper peripheral edge of the recess, the recess having an inner bottom surface and an inner side surface that is continuous with the inner bottom surface; heat-treating a remaining portion of the bank material layer, the remaining portion of the bank material layer being made fluid so that the bank material layer extends to cover the upper peripheral edge of the recess, forming functional layers including a light-emitting layer above an exposed surface of the tungsten oxide layer after the heat treatment; and forming a cathode above the functional layer.

As another aspect of the present invention, an ultraviolet photoelectron spectroscopy spectrum of the tungsten oxide layer may exhibit an upward protrusion that is approximately 1.8 electron volts to approximately 3.6 electron volts lower than a lowest energy level of a valence band of the tungsten oxide layer in terms of a binding energy.

As another aspect of the present invention, a differential spectrum obtained by differentiating an ultraviolet photoelectron spectroscopy spectrum of the tungsten oxide layer may have a shape that is expressed by a non-exponential function throughout a range between approximately 2.0 electron volts and approximately 3.2 electron volts lower than the lowest energy level of the valence band in terms of the binding energy.

In the following, description is provided on an organic EL element pertaining to the embodiments of the present invention. Subsequently, results and observations will be presented for each of the experiments having been performed to assess the efficiency of the present invention.

It is to be noted that, in each of the accompanying figures, the relation between sizes of each of the members are not illustrated directly reflecting the actual relation.

Embodiment 1

(Structure of Organic EL Element)

FIG. 1 is a schematic cross-sectional view illustrating the structure of an organic EL element 1000 pertaining to the embodiment.

The organic EL element 1000 is an application-type organic EL element, which is characterized in that a functional layer is applied by a wet process in the manufacturing thereof. The organic EL element 1000 includes: a hole injection layer 4; various functional layers (a buffer layer 6A and a light-emitting layer 6B, in this case); and a pair of electrodes composed of an anode 2 and a cathode 8. The hole injection layer 4 and the functional layers are disposed one on top of the other, and are disposed between the pair of electrodes. Each of the organic layers contains functional material having a predetermined function.

More specifically, the organic EL element 1000 includes, as illustrated in FIG. 1, the anode 2, the hole injection layer 4, the buffer layer 6A, the light-emitting layer 6B, and the cathode 8 (composed of a barium layer 8A and an aluminum layer 8B), which are disposed in the stated order on one main surface of a substrate 1.

The substrate 1 is formed with insulating materials such as soda glass, nonfluorescent glass, phosphate glass, borate glass, quartz, acrylic resin, styrenic resin, polycarbonate resin, epoxy resin, polyethylene, polyester, silicone resin, and alumina. Predetermined TFT wire is provided on one side of the substrate.

The anode 2 can be formed from APC (alloy of silver, palladium, and copper), ARA (alloy of silver, rubidium, and gold), MoCr (alloy of molybdenum and chromium), NiCr (alloy of nickel and chromium), etc. In the case of a top emission type light-emitting element, it is preferable that the anode 2 be formed with a light-reflective material.

(Hole Injection Layer)

The hole injection layer 4 is composed of a 30 nm-thick tungsten oxide thin film (layer). In the composition formula (WOx) denoting the composition of tungsten oxide, x is a real number existing within a range of approximately $2<x<3$.

Concerning the hole injection layer 4, it is preferable that the hole injection layer 4 consist of only tungsten oxide. However, the inclusion of a trace level of impurities is acceptable, provided that the amount does not exceed the amount of impurities which may be incorporated as a result of normal processing.

Here, the hole injection layer 4 is formed under specific conditions. It is by forming the hole injection layer under such specific conditions that the hole injection layer is provided, in an electronic state thereof, with an occupied energy level which is 1.8 eV to 3.6 eV lower than the lowest energy level of a valence band of the hole injection layer, in terms of binding energy. Furthermore, the occupied energy level corresponds to the energy level of the highest occupied molecular orbital (HOMO) of the hole injection layer 4. That is, in the electronic state of the hole injection layer 4, the occupied energy level is closest to the Fermi surface of the hole injection layer 4, in terms of binding energy. As such, the occupied energy level of the hole injection layer is referred to as "the occupied energy level near the Fermi surface" in the following description.

The existence of the occupied energy level near the Fermi surface results in a so-called interface energy level alignment being formed at an interface between the hole injection layer 4 and the functional layer (the buffer layer 6A, in this case). By the interface energy level alignment being formed, the energy level of the HOMO of the buffer layer 6A substantially equals the occupied energy level near the Fermi surface of the hole injection layer 4, in terms of binding energy.

Note that the expressions "substantially equals" and "interface energy level alignment being formed" as referred to herein indicate a state where a gap between the lowest occupied energy level near the Fermi surface of the hole injection layer 4 and the lowest energy level of the HOMO of the functional layer, at an interface between the hole injection layer and the functional layer, is equal to or less than 0.3 eV in terms of binding energy.

Furthermore, the expression "interface" as referred to here denotes an area which includes a surface of the hole injection layer 4 facing the buffer layer 6A, and a portion of the buffer layer 6A which is within 0.3 nm in distance from the surface of the hole injection layer 4 facing the buffer layer 6A.

Concerning the occupied energy level, it is preferable that the occupied energy level near the Fermi surface is provided to all portions of the hole injection layer 4. However, the present invention is not limited to this. Other cases are included within the scope of the present invention, provided that the occupied energy level near the Fermi surface is provided at least at the interface between the hole injection layer 4 and the buffer layer 6A.

(Banks)

On the surface of the hole injection layer 4, banks 5 composed of organic material with insulating property (for instance, acrylic resins, polyimide resins, novolac-type phenolic resins and the like) are formed. The banks 5 are disposed such that each of the banks has a uniform trapezoidal cross-section, and such that the banks form either a line bank structure or a pixel bank structure on the surface of the hole injection layer 4. By the provision of the banks 5, the surface of the hole injection layer 4 is divided into a plurality of sections. At each of the sections on the surface of the hole injection layer 4, a functional layer is formed. The functional layer includes the buffer layer 6A, and a light-emitting layer 6B of a corresponding color among the colors of R, G, and B. As is illustrated in FIG. 1, when applying the organic EL element 1000 to an organic EL panel, a plurality of units (pixels) of organic EL elements 1000 are disposed in parallel on the surface of the substrate 1. More specifically, each unit, or pixel, is a series of three organic EL elements 1000, and each of the three organic EL elements 1000 in a pixel is allocated to a corresponding one of the colors R, G, and B.

Here, it should be noted that the banks 5 are not essential to the present invention, and when an organic EL element 1000 is to be used alone, the banks need not be formed.

(Buffer Layer)

The buffer layer 6A is a 20 nm-thick layer of TFB (poly(9, 9-di-n-octylfluorene-alt-(1,4-phenylene-((4-sec-butylphenyl)imino)-1, 4-phenylene)), which is an amine-containing organic polymer.

(Light-Emitting Layer)

The light-emitting layer 6B is a 70 nm-thick layer of F8BT (poly(9,9-di-n-octylfluorene-alt-benzothiadiazole)), which is an organic polymer. However, the material to be used in forming the light-emitting layer 6B is not limited to this, and the light-emitting layer 6B may include a commonly-known organic material. Examples of such commonly-known organic material for the light-emitting layer 6B include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Functional Layer)

The functional layer of the present invention is either one of, a combination of more than two of, or all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element 1000 or for blocking electrons. Although the target of the present invention is the hole injection layer, an organic EL element commonly includes layers having each of the functions of the above-described hole transfer layer, light-emitting layer and the like, in addition to the hole injection layer. As such, the expression "functional layer" in the embodiment refers to all such layers which need to be included in the organic EL element, in addition to the hole injection layer.

(Electrodes, Substrate, Etc.)

The cathode 8 includes a 5 nm-thick barium layer 8A and a 100 nm-thick aluminum layer 8B, which are disposed one on top of the other.

The anode 2 and the cathode 8 are connected to a power supply DC, and thereby the organic EL element 1000 is supplied with power from the outside.

The substrate 1 may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

(Effects and Advantages Produced by the Organic EL Element)

As described in the above, the organic EL element 1000 includes the hole injection layer 4 having the occupied energy level near the Fermi surface. Thus, the hole injection barrier between the hole injection layer 4 and the buffer layer 6A is lowered. Hence, when voltage is applied to the organic EL element 1000 during driving thereof, holes are injected smoothly, and at a low voltage, from the occupied energy level near the Fermi surface of the hole injection layer 4 to the HOMO of the buffer layer 6A. As a result, the organic EL element 1000 of the present invention exhibits excellent hole injection efficiency.

Note that there has been a report made of the technology of applying tungsten oxide as the material of the hole injection layer (refer to Non-Patent Literature 1). However, the hole injection layer as obtained in Non-Patent Literature 1 has an exemplary thickness of approximately 0.5 nm, and the voltage-electric current characteristics of the hole injection layer depends largely on film thickness. Thus, the hole injection layer of Non-Patent Literature 1 does not exhibit a level of practicality which enables application thereof to the mass production of large-sized organic EL panels. Furthermore, Non-Patent Literature 1 does not suggest forming the occupied energy level near the Fermi surface in the hole injection layer in a constructive manner. Hence, it is concluded that the present invention largely differs from conventional technology. The present invention is characterized in that a predetermined occupied energy level near the Fermi surface is provided to a chemically-stable hole injection layer that is composed of tungsten oxide and that withstands processing during mass production of large-sized organic EL panels. This provides the hole injection layer with excellent hole injection efficiency, and enables the organic EL element to be driven at a low voltage.

In the following, description is provided of an example of a method for manufacturing the entire organic EL element 1000.

(Manufacturing Method of the Organic EL Element)

Firstly, the substrate 1 is mounted inside a chamber of a sputtering film-forming device. Then, a predetermined sputtering gas is introduced into the chamber, and the 50 nm-thick anode 2 composed of ITO is formed according to the reactive sputtering method.

The forming of the hole injection layer 4 is performed subsequently. Here, it is preferable that the hole injection layer 4 be formed similarly according to the reactive sputtering method. Especially, in a case where the organic EL element of the present invention is to be applied to a large-sized organic EL panel, the hole injection layer needs to be formed over a large area. In such a case, the forming of the hole injection layer according to the vapor deposition method is problematic in that there is a risk that unevenness may be formed in terms of film thickness, etc. The occurrence of such unevenness can be readily prevented by forming the hole injection layer 4 according to the reactive sputtering method.

More specifically, the reactive sputtering method is performed after replacing the previous sputtering target with metal tungsten. Further, argon gas and oxygen gas are respectively introduced into the chamber as the sputtering gas and the reactive gas. Under this condition, the argon in the argon gas is ionized by the application of high voltage, and the ionized argon is caused to bombard the sputtering target. The metal tungsten ejected as a result of the sputtering phenomenon reacts with the oxygen, and produces tungsten oxide. As a result, the "sputtered" tungsten oxide forms a film on the anode 2 of the substrate 1.

Note that in the forming of the hole injection layer 4, it is preferable that the tungsten oxide film be formed under conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm2 and lower than or equal to 2.8 W/cm2. By forming the hole injection layer 4 under such conditions, the hole injection layer 4 having an occupied energy level which is 1.8 eV to 3.6 eV lower than the lowest energy level of a valence band of the hole injection layer, in terms of binding energy, is yielded.

Subsequently, as the material for forming the banks 5, photosensitive resin material or, more preferably, photoresist material containing fluorine material is to be prepared. In order to form the banks 5, first, the bank material so prepared is uniformly applied on the hole injection layer 4. After performing prebaking, a mask having an aperture of a predetermined shape (a pattern of the banks 5 to be formed) is placed over the prebaked bank material. After exposing the bank material to light from over the mask, unhardened, redundant bank material is removed by using a developer. Finally, by performing rinsing with pure water, the banks 5 are yielded.

Here, it should be noted that in the embodiment of the present invention, the hole injection layer 4 is composed of tungsten oxide. Tungsten oxide has resistance with respect to dissolution, decomposition, and degradation by alkaline solutions, water, organic solvents, etc. For this resistance, even when the hole injection layer 4 having been formed falls into contact with such solutions, pure water, etc. in the subsequent bank forming process, damage to the hole injection layer 4, by dissolution, decomposition, degradation and the like, is prevented. Thus, the hole injection layer 4 maintains an appropriate form thereof at the completion of the manufacturing of the organic EL element 1000. This too, in addition to the above-described characteristics of the present invention, enables the efficient injection of holes to the buffer layer 6A via the hole injection layer 4, and further enables the organic EL element 1000 to be driven at a low voltage.

Following this, the buffer layer 6A is formed by ejecting drops of ink composition containing organic amine-containing molecular material onto a surface of the hole injection layer 4, which is exposed from between adjacent ones of banks 5, and removing the solvent of the ink composition by volatilization. The ejection of ink composition is performed according to a wet process, such as the inkjet method and the gravure printing method.

Following the forming of the buffer layer 6A, drops of ink composition containing organic light-emitting material is ejected onto the surface of the buffer layer 6A, and again, the solvent of the ink composition is removed by volatilization by applying a similar method as in the forming of the buffer layer 6A. Thus, the light-emitting layer 6B is formed.

Here, it should be noted that the method applied for forming the buffer layer 6A and the light-emitting layer 6B is not limited to the above-described method. Other commonly-known methods besides the inkjet method and the gravure printing method may be applied for the ejection/application of ink. Such commonly-known methods include: the dispenser method; the nozzle coating method; the spin coating method; the intaglio printing method; the relief printing method and the like. Subsequently, the barium layer 8A and the aluminum layer 8B are formed on a surface of the light-emitting layer 6B by applying the vacuum vapor deposition method. Thus, the cathode 8 is formed.

It should be noted that, although not illustrated in FIG. 1, a sealing layer may be additionally provided on the surface of the cathode 8, or a sealing cap may be provided to isolate the entire organic EL element 1000 from external space, in order as to prevent atmospheric exposure of the organic EL element 1000. The sealing layer may be formed, for instance, by using materials such as SiN (silicon nitride) and SiON (silicon oxynitride), and may be disposed such that the organic EL element 1000 is sealed therein. When using a sealing cap to prevent atmospheric exposure of the organic EL element 1000, the sealing cap may be formed by using, for instance, the same material as the substrate 1, and a getter which absorbs moisture and the like may be provided within the sealed space formed by the substrate 1 and the sealing cap.

By following the above-provided procedures, the manufacturing of the organic EL element 1000 is completed.

<Experiments and Observations>

(Conditions for Forming the Tungsten Oxide Layer)

In the embodiment of the present invention, the hole injection layer 4 is yielded by forming a film of tungsten oxide under predetermined conditions. The forming of the tungsten oxide film under such film forming conditions provides the hole injection layer 4 with the occupied energy level near the Fermi surface, which results in the hole injection barrier between the injection layer 4 and the buffer layer 6A being reduced. Furthermore, the organic EL element 1000 having a hole injection layer formed under such film forming conditions can be driven at a low voltage.

In order as to obtain a tungsten oxide film having the above-described characteristics, a DC magnetron sputtering device is used in the forming thereof. The sputtering target is metal tungsten, and the processing is performed while not controlling substrate temperature, and by introducing argon gas and oxygen gas into the chamber of the sputtering device. In such an environment, the tungsten oxide film is formed by applying the reactive sputtering method under film forming conditions where: (i) gas pressure (total gas pressure) is higher than 2.7 Pa and lower than or equal to 7.0 Pa; (ii) the ratio of oxygen partial pressure to the total gas pressure is higher than or equal to 50% and lower than or equal to 70%; and (iii) input power per unit surface area of the sputtering target (input power density) is higher than or equal to 1 W/cm$^2$ and lower than or equal to 2.8 W/cm$^2$.

The effectiveness of such film forming conditions (i) through (iii) have been proved through the following experiments.

Firstly, the inventors prepared hole-only devices as assessment devices to be used in accurately determining the dependence of hole injection efficiency on the conditions under which the tungsten oxide film is formed. Needless to say, here the expression "hole injection efficiency" refers to the efficiency with which holes are injected into the buffer layer 6A from the hole injection layer 4.

Basically, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 2:
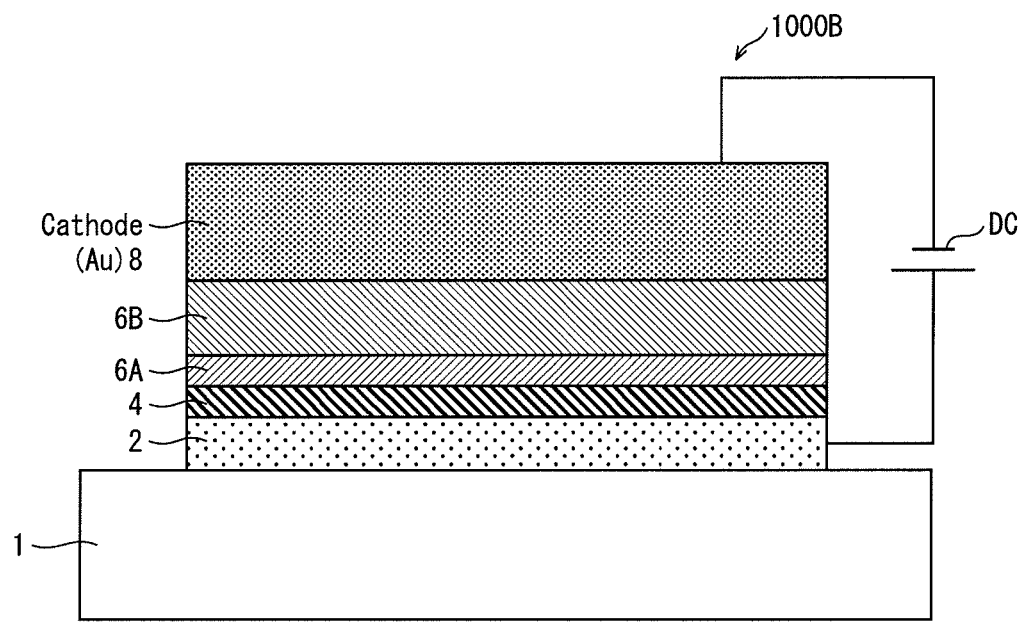
FIG. 2 is a schematic cross-sectional view illustrating a structure of a hole-only device.

In detail, the hole-only devices prepared by the inventors were actually obtained by replacing the cathode 8 of the organic EL element 1000 illustrated in FIG. 1 with gold (Au) to form a cathode 9 as illustrated in FIG. 2. That is, the inventors obtained the hole-only device illustrated in FIG. 2 by forming a 50 nm-thick anode 2 composed of an ITO thin film on a substrate 1, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and a 100 nm-thick cathode 9 composed of gold. Note that, considering that the hole-only devices are devices prepared for the sole sake of assessment, the banks 5 included in the structure of the organic EL element 1000 are omitted from the structure of the hole-only devices.

In the manufacturing of the hole-only devices, the hole injection layers 4 of the hole-only devices were similarly formed by applying the reactive sputtering method in a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order as to obtain the hole-only devices, changes were made to certain film forming conditions, namely total gas pressure, oxygen partial pressure, and input power, as illustrated in Table 1. As a result, hole-only devices 1000B (devices No. 1 through 14), each having a hole injection layer 4 formed under different film forming conditions, were obtained. Note that, hereinafter, oxygen partial pressure is indicated as a ratio (%) with respect to the total pressure of the gases in the chamber of the sputtering device.

TABLE 1

Film Forming Conditions of the Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

Following the completion of the preparation of the hole-only devices 1000B, the inventors connected each of the hole-only devices 1000B to a direct current power supply DC, and applied voltage thereto. Further, the inventors obtained an electric current value per unit surface area (current density) for each of the hole-only devices 1000B. More specifically, the voltage applied to the hole-only devices was changed, and a value indicating electric current flowing was obtained at different voltages. Further, conversion was performed on the electric current values to obtain an electric current density value of the hole-only devices 1000B. Note that hereinafter, the expression "driving voltage" refers to different voltages applied to the hole-only devices 1000B when the current density value is 10 mA/cm$^2$.

In short, it could be said that the smaller the driving voltage, the higher the hole injection efficiency of the hole injection layer 4 is. This is since, the members composing the hole-only devices 1000B, other than the hole injection layer 4, are prepared according to the same manufacturing method, and thus, it could be assumed that the hole injection barrier between two adjacent layers, other than the hole injection layer 4, is uniform in each of the hole-only devices 1000B. In addition, it has been confirmed through another experiment that the cathode 2 and the hole injection layer 4 in each of the hole-only devices 1000B used in this experiment are in ohmic contact. Considering the above, it could be expected that the differences in driving voltage of the hole-only devices 1000B resulting from the different film forming conditions strongly reflects the hole injection efficiency from the hole injection layer 4 to the buffer layer 6A in each of the hole-only devices 1000B.

Table 3 illustrates each of the hole-only devices 1000B and a driving voltage thereof. Further, the hole-only devices are classified in Table 3 according to the film forming conditions under which the hole injection layer 4 of each of the hole-only devices 1000B was formed. More specifically, classification is made according to the film forming conditions of: total pressure; oxygen partial pressure; and input power. Note that the numbers enclosed in circles in Table 3 indicate the device number of each of the hole-only devices 1000B.

TABLE 3

Film Forming Conditions and Driving Voltages of the Hole-only Devices 1B
(Applied Voltage Value under Electric Current Density of 10 mA/cm²)

| | | Total Pressure | | |
|---|---|---|---|---|
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V)<br>② 500 W (13.7 V)<br>⑧ 1000 W (>20 V) |
| | 70% | ⑪ 500 W (Unmeasured) | ⑤ 250 W (14.7 V)<br>① 500 W (18.2 V)<br>⑦ 1000 W (>20 V) | Film could not be formed |
| | 100% | ⑥ 250 W (Unmeasured)<br>③ 500 W (>20 V)<br>⑨ 1000 W (>20 V) | Film could not be formed | Film could not be formed |

*Numbers enclosed in circles indicate device No., numbers without parenthesis indicate input electricity, and numbers placed in parenthesis indicate driving voltage.

Further, FIGS. 3A through 3C are graphs illustrating the dependence of driving voltages of the hole-only devices 1000B on the film forming conditions. Each of the points in FIG. 3A indicate, from left to right in the figure, a driving voltage of the devices No. 4, 10, and 2. Similarly, each of the points in FIG. 3B indicates, from left to right in the figure, a driving voltage of the devices No. 13, 10, and 1. Finally, each of the points in FIG. 3C indicates, from left to right in the figure, a driving voltage of the devices No. 14, 2, and 8.

Here, it should be noted that under the following conditions (i) through (iv), the forming of the hole injection layer 4 was not successfully performed due to limitations of the sputtering device, such as gas flow amount. In specific, the hole injection layer 4 was not formed when: (i) total pressure was 2.7 Pa and oxygen partial pressure ratio was 100%; (ii) total pressure was 4.8 Pa and oxygen partial pressure ratio was 30%; (iii) total pressure was 4.8 Pa and oxygen partial pressure ratio was 70%; and (iv) total pressure was 4.8 Pa and oxygen partial pressure ratio was 100%.

Firstly, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 3A. In addition, as a result of a different experiment, it was found that this trend of reduction in driving voltage continues at least until the total pressure is lower than or equal to 7.0 Pa. Taking this into account, it is preferable that total pressure during the forming of the hole injection layer 4 be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 3B. However, as a result of a different experiment, it was found that when the oxygen partial pressure ratio exceeds this range, the driving voltage begins to increase adversely. Taking this into account, it is preferable that oxygen partial pressure ratio during the forming of the hole injection layer 4 be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 3C. Taking this into account, it is preferable that input power be restricted to be lower than or equal to 500 W. Here, it should be noted that, when referring to devices No. 1 and 3 in Table 3, it could be seen that, even when the input power was set to 500 W, driving voltage increased when the total pressure was set lower than or equal to 2.7 Pa.

The subsequent FIG. 4 illustrates an electric current density-applied voltage curve of the hole-only devices 1000B, taking devices No. 14, 1, and 7 as examples. In FIG. 4, the vertical axis indicates electric current density (mA/cm²), whereas the horizontal axis indicates applied voltage (V). Furthermore, device No. 14 fulfills all desirable film forming conditions explained in the above of total pressure, oxygen partial pressure, and input power, while on the other hand, each of devices No. 1 and 7 does not fulfill at least one of the desirable film forming conditions.

Concerning the film forming conditions under which the hole injection layer 4 (and the later-described tungsten oxide layer 80) is formed, in order as to facilitate the explanations to be provided in the following, hereinafter, the film forming conditions under which the hole injection layer 4 was formed in device No. 14 is referred to as film forming conditions A, the film forming conditions under which the hole injection layer 4 was formed in device No. 1 is referred to as film forming conditions B, and the film forming conditions under which the hole injection layer 4 was formed in device No. 7 is referred to as film forming conditions C. In addition, devices No. 14, 1, and 7 are respectively illustrated as HOD-A, HOD-B, and HOD-C in FIG. 4 and Table 3.

As illustrated in FIG. 4, the electric current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high electric current density compared with HOD-B and HOD-C. From this, it is obvious that HOD-A has a higher degree of hole injection efficiency compared with HOD-B and HOD-C. Here, it should be noted that HOD-A operates at the lowest driving voltage among the hole-only devices 1000B.

In the above, observation has been made of the hole injection efficiency of the hole injection layer 4 in each of the hole-only devices 1000B. However, here it should be emphasized that the hole-only devices 1000B and the organic EL element 1000 illustrated in FIG. 1 have nearly the same structure, differing only in the cathodes included. Therefore, the dependence of the hole injection efficiency from the hole injection layer 4 to the buffer layer 6A on the film forming conditions under which the hole injection layer 4 is formed is basically the same in the organic EL element 1000 and in the hole-only devices 1000B. In order as to confirm the existence of such a similar dependence on the film forming conditions under which the hole injection layer 4 is formed, the inventors prepared three separate organic EL elements 1000, each having a hole injection layer 4 formed under a corresponding one of film forming conditions A, film forming conditions B, and film forming conditions C.

More specifically, the inventors prepared the organic EL elements 1000 illustrated in FIG. 1 by forming the 50 nm-thick anode 2 composed of an ITO thin film on the substrate 1, and further disposing, one the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; and the cathode 8 composed of a 5 nm-thick barium layer and a 100 nm-thick aluminum layer. Note that, considering that the organic EL elements 1000 are assessment devices, the banks 5 were omitted from the structure thereof.

Figure 5:
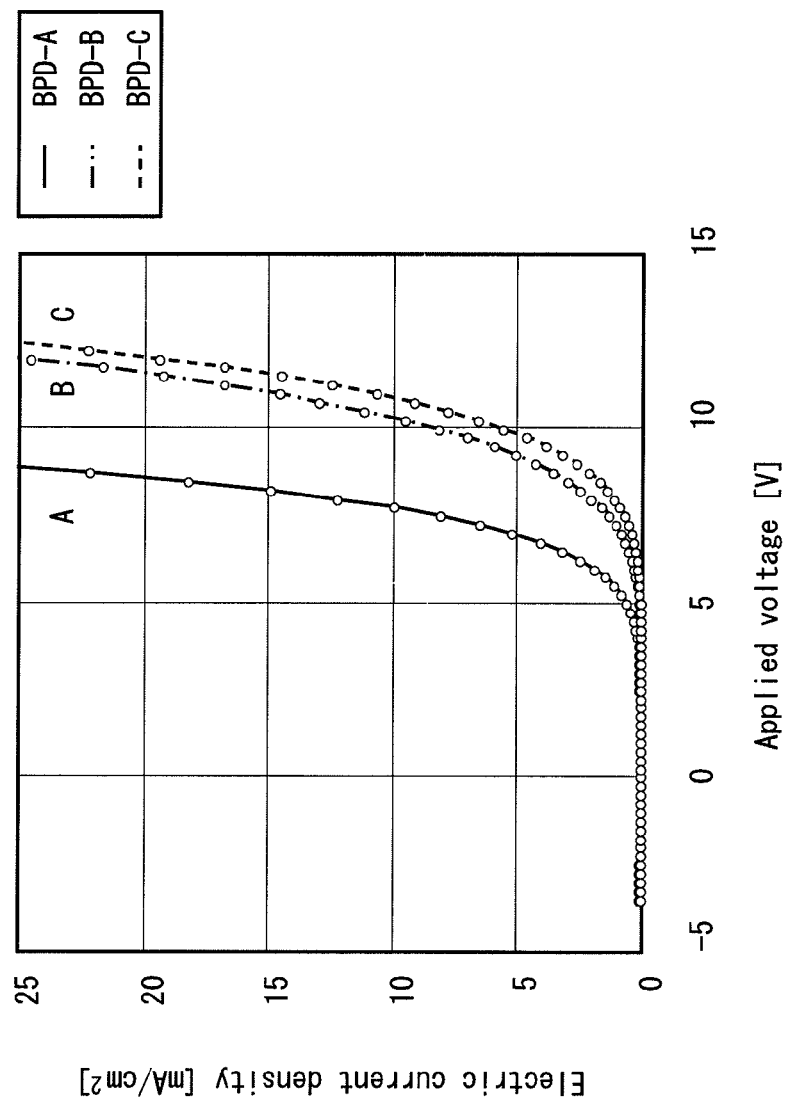
FIG. 5 is a device characteristics diagram showing a relation curve illustrating a relation between applied voltage and electric current density of organic EL elements prepared by the inventors.

The inventors connected the organic EL elements 1000 prepared under the corresponding one of the film forming conditions A, B, and C to a direct current power supply DC, and applied voltage thereto. FIG. 5 illustrates an electric current density-applied voltage curve indicating the relation between the electric current density value and the applied voltage. More specifically, the inventors obtained an electric current value per unit surface area (electric current density) for each of the organic EL elements 1000 by changing the voltage applied to the organic EL elements 1000, obtaining a value indicating electric current flowing at different voltages, and converting the electric current value into the electric current density value. In FIG. 5, the vertical axis indicates electric current density (mA/cm$^2$), whereas the horizontal axis indicates applied voltage (V).

Note that, in order as to facilitate the explanations to be made in the following, the organic El elements 1000 prepared under film forming conditions A, B, and C are respectively illustrated as BPD-A, BPD-B, and BPD-C in FIG. 5.

As illustrated in FIG. 5, the electric current density-applied voltage curve indicating BPD-A indicates that HOD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 6:
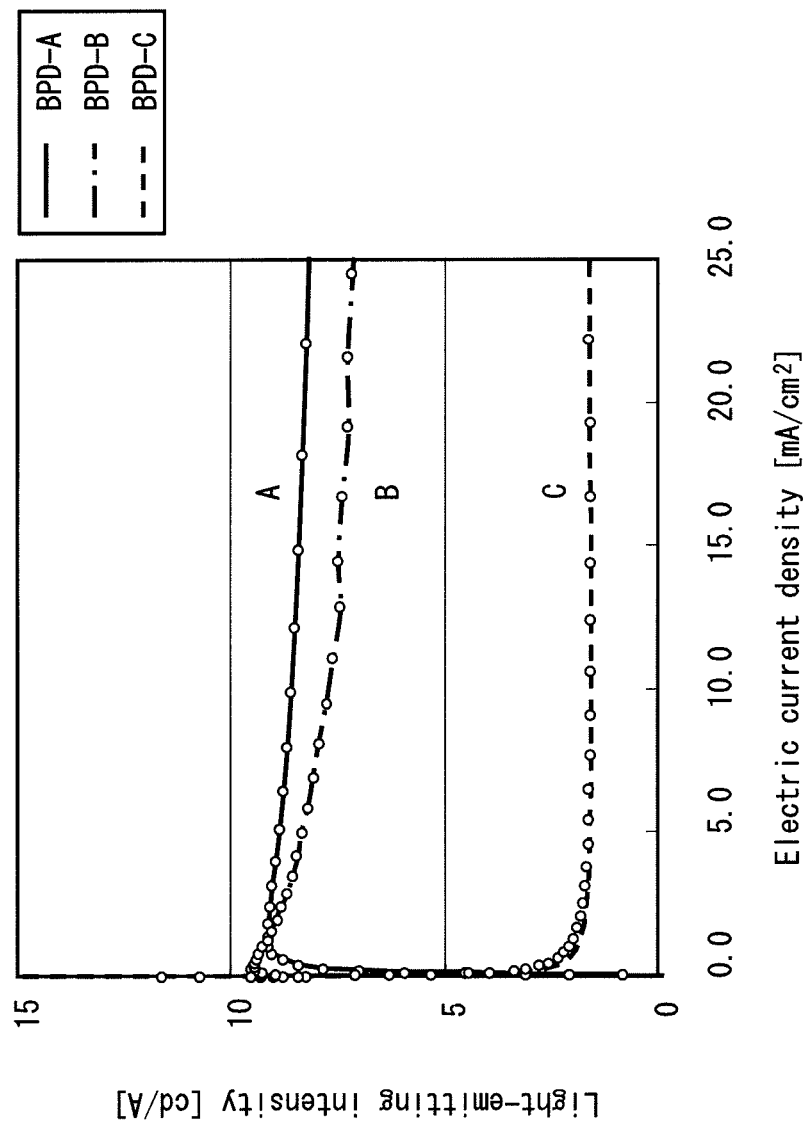
FIG. 6 is a device characteristics diagram showing a relation curve illustrating a relation between electric current density and light-emitting intensity of the organic EL elements prepared by the inventors.

In addition, FIG. 6 illustrates light-emitting intensity-electric current density curves corresponding to the organic EL elements 1000 prepared in the above. Each light-emitting intensity-electric current density curve indicates the relation between the change in electric current density and the resultant change in light-emitting intensity of the corresponding organic EL element 1000. In FIG. 6, the vertical axis indicates light-emitting intensity (cd/A), whereas the horizontal axis indicates electric current density (mA/cm$^2$). According to FIG. 6, it can be seen that BPD-A has the highest light-emitting intensity among the three organic EL elements 1000, at least within the range of electric current density that was measured in the experiment.

From the above results, it was confirmed that, concerning the organic EL elements 1, the hole injection efficiency of the hole injection layer 4 depends on the film forming conditions, similar as in the case of the hole-only devices 1000B. That is, when forming the tungsten oxide film composing the hole injection layer 4 by using metal tungsten as the sputtering target in a DC magnetron sputtering device by applying the reactive sputtering method while no control is performed with respect to substrate temperature and the chamber gas used is composed of argon gas and oxygen gas, a hole injection layer having the highest hole injection efficiency with respect to the buffer layer 6A was produced under film forming conditions where: (i) total pressure is higher than 2.7 Pa and lower than or equal to 7.0 Pa; (ii) oxygen partial pressure ratio is higher than or equal to 50% and lower than or equal to 70%; and (iii) input power density is higher than or equal to 1 W/cm$^2$ and lower than or equal to 2.8 W/cm$^2$. Thus, it was confirmed that a hole injection layer 4 formed while fulfilling such exemplary film forming conditions (i), (ii), and (iii) realizes both low voltage drive and high light-emitting efficiency.

Note that in the above, the film forming condition (iii) concerning input power is indicated in terms of input power density by referring to Table 2. In addition, when using a DC magnetron sputtering device that is different from the DC magnetron sputtering device used in the present experiment, a hole injection layer 4 composed of tungsten oxide having a high hole injection efficiency can be similarly yielded by adjusting input power according to the size of the sputtering target. The adjustment of input power should be performed such that the input power density fulfills condition (iii) above. Concerning the other conditions (i) and (ii), total pressure and oxygen partial pressure should each be set within the above-provided range, regardless of the device to be used and the size of the sputtering target.

Additionally, as already explained in the above, no intentional adjustment of the substrate temperature was performed while forming the hole injection layer 4 by applying the reactive sputtering method. And during the experiment, the sputtering device was placed under room temperature. Therefore, the substrate was at room temperature at least before the forming of the hole injection layer 4 was performed. However, while forming of the hole injection layer 4 is being performed, there is a possibility that the substrate temperature may rise by several tens of degrees Celsius.

Furthermore, the organic EL element 1000 having the hole injection layer 4 formed under film forming conditions A corresponds to the organic EL element 1000 in the embodiment of the present invention, which has the occupied energy level near the Fermi surface. Detailed observation is to be made regarding this point in the following.

(Electronic State of the Hole Injection Layer)

The tungsten oxide composing the hole injection layer 4 of the organic EL element 1000 pertaining to the embodiment of the present invention has the occupied energy level near the Fermi surface. The occupied energy level near the Fermi surface is formed by adjusting the film forming conditions under which the hole injection layer 4 is formed as description has been provided in the above. Details concerning this point are provided in the following.

The inventors conducted an experiment to determine whether the occupied energy level near the Fermi surface exists in each of the tungsten oxide films formed under a corresponding one of film forming conditions A, B, and C.

Figure 7:
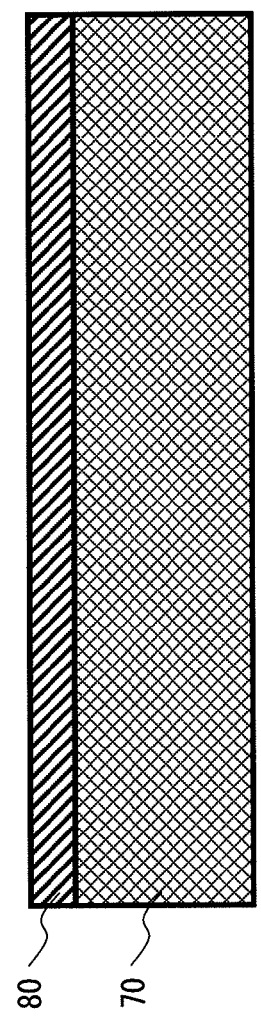
FIG. 7 is a schematic cross-sectional view illustrating a structure of a sample device which is used for photoelectron spectroscopy measurement.

The inventors prepared sample devices to be subjected to photoelectron spectroscopy measurement. Each of the sample devices was prepared under a corresponding one of the film forming conditions A, B, and C. In detail, each of the sample devices were prepared by forming a 10 nm-thick tungsten oxide layer 80 (corresponding to the hole injection layer 4) on a conductive silicon substrate 70 by applying the reactive sputtering method as described in the above. 1A in FIG. 7 indicates a sample device having such a structure. So as to facilitate explanation provided in the following, a sample device 1A formed under film forming conditions A is hereinafter referred to as sample device A, a sample device 1A formed under film forming conditions B is hereinafter referred to as sample device B, and a sample device 1A formed under film forming conditions C is hereinafter referred to as sample device C.

The forming of the tungsten oxide layer 80 of each of the sample devices was performed inside a sputtering device. Then, to prevent atmospheric exposure, the sample devices A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 80 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 80 by utilizing UPS measurement.

The conditions under which the UPS measurement was conducted are as follows. Here, it should be noted that, since the sample devices A, B, and C commonly include the conductive silicon substrate 70, charge-up did not occur during the UPS measurement. Further, the interval between measurement points was set to 0.05 eV.

Figure 8:
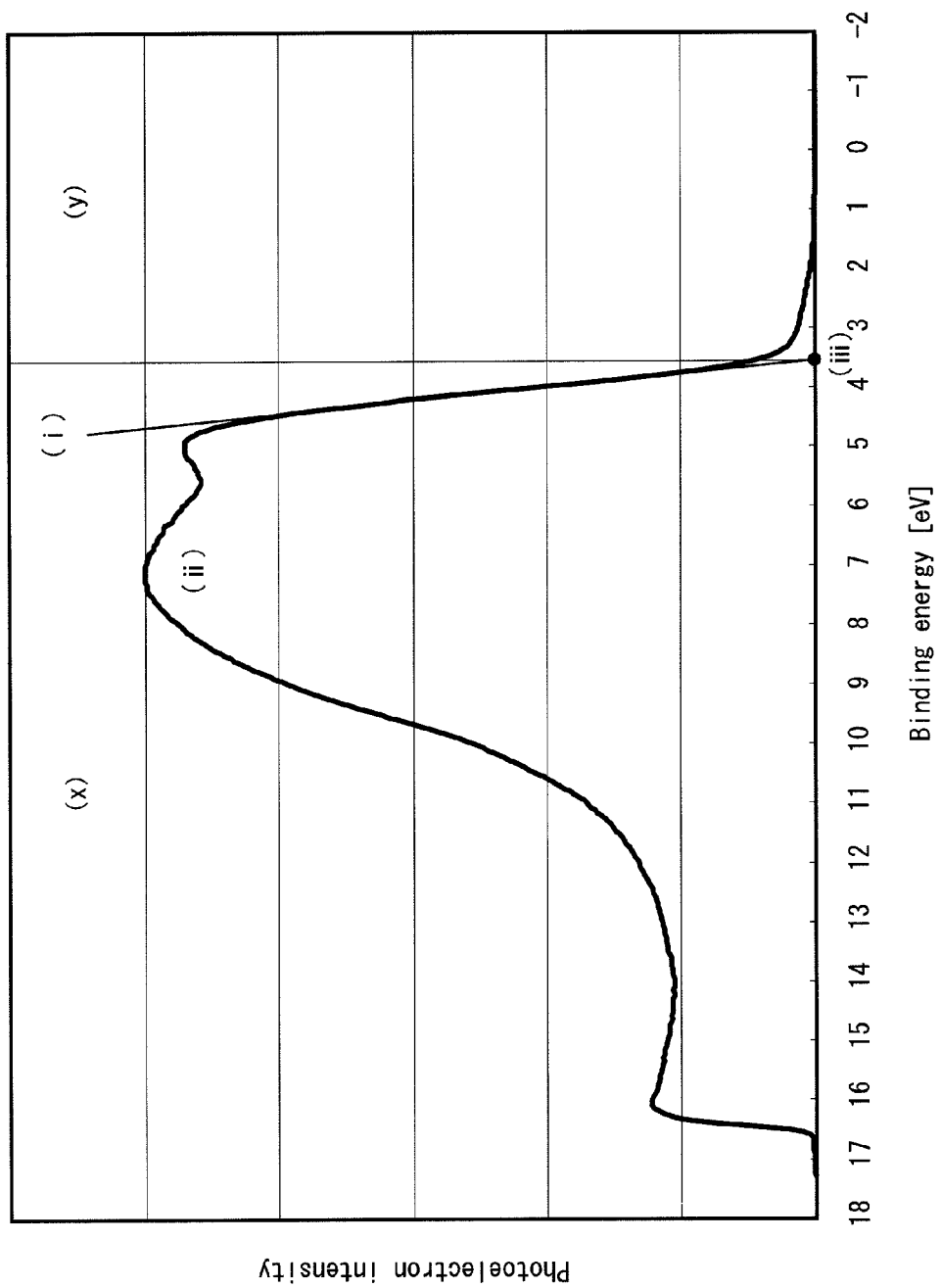
FIG. 8 illustrates a UPS spectrum of tungsten oxide.

Light source: He I line
Bias: None
Electron emission angle: Normal line direction of the substrate surface FIG. 8 illustrates a UPS spectrum of the tungsten oxide layer 80 of the sample device A. In FIG. 8, the horizontal axis indicates binding energy. The reference point on the horizontal axis corresponds to the Fermi surface of the substrate 70, and the left direction with respect to the reference point is positive, and the right direction with respect to the reference point is negative.

In the following, description is provided on each of the occupied energy levels of the tungsten oxide layer 80 with reference to FIG. 8.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area (x) that extends in the high binding energy direction departing from point (iii); and area (y) that extends in the low binding energy direction (that is, to the direction of the Fermi surface) departing from point (iii).

Here, according to Table 4, each of the sample devices A, B, and C has a tungsten oxide layer 80 whose composition ratio between tungsten atoms and oxygen atoms is approximately 1:3. The composition ratios illustrated in Table 4 were obtained by performing X-ray photoelectron spectroscopy (XPS) measurement with respect to each of the sample devices A, B, and C. More specifically, XPS measurement of the sample devices was performed by using the photoelectron spectroscopy device while preventing atmospheric exposure of the tungsten oxide layer 80 having been formed on the sample devices, in a similar way as in the conduction of the UPS measurement. By conducting the XPS measurement, the composition ratio between tungsten and oxygen within several nanometers in distance from the surface of the tungsten oxide layer 80 was estimated for each of the sample devices A, B, and C. Note that the film forming conditions under which the tungsten oxide layer 80 in each of the corresponding sample devices were formed are also illustrated in Table 4.

TABLE 4

| | Sample Device | | |
|---|---|---|---|
| | Sample Device A | Sample Device B | Sample Device C |
| | Film Forming Conditions | | |
| | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

According to the composition ratios obtained as a result of the XPS measurement, it could be assumed that in each of the sample devices A, B, and C, the tungsten oxide layer 80, at least within several nanometers in distance from the surface thereof, has a basic atomic arrangement which is in accordance with the atomic arrangement of tungsten trioxide. That is, the basic structure of the tungsten oxide layer 80 is assumed as being a structure where oxygen atoms are bound to a tungsten atom to form an octahedral coordination, and these octahedrons share oxygen atoms at corners thereof with adjacent octahedrons. Taking this into account, the area (x) in FIG. 8 indicates an occupied energy level deriving from the basic structure of the tungsten oxide layer 80 as mentioned in the above, which is the structure of the crystalline phase of tungsten trioxide or of a non-crystalline phase of tungsten trioxide, which lacks the order characteristic of the crystalline phase (note that the bond between atoms is maintained in the non-crystalline phase, and therefore the above-mentioned basic structure is preserved). Thus, the area (x) in FIG. 8 corresponds to a so-called valence band of the tungsten oxide layer 80. Note that the inventors of the present invention have performed X-ray absorption fine structure (XAFS) measurement with respect to the tungsten oxide layer 80 of each of the sample devices A, B, and C, and have confirmed that the above-mentioned basic structure is formed therein.

Accordingly, the area (y) in FIG. 8 corresponds to the band gap between the valence band and the conductive band of the tungsten oxide layer 80. Further, it is commonly known that an occupied energy level that differs from the occupied energy level of the valence band may exist in the area (y) of the tungsten oxide, as is suggested by the UPS spectrum in FIG. 8. The occupied energy level in area (y) derives from another structure that is different from the above-mentioned basic structure, and is referred to as a so-called band gap (in-gap state or gap state) energy level.

Figure 9:
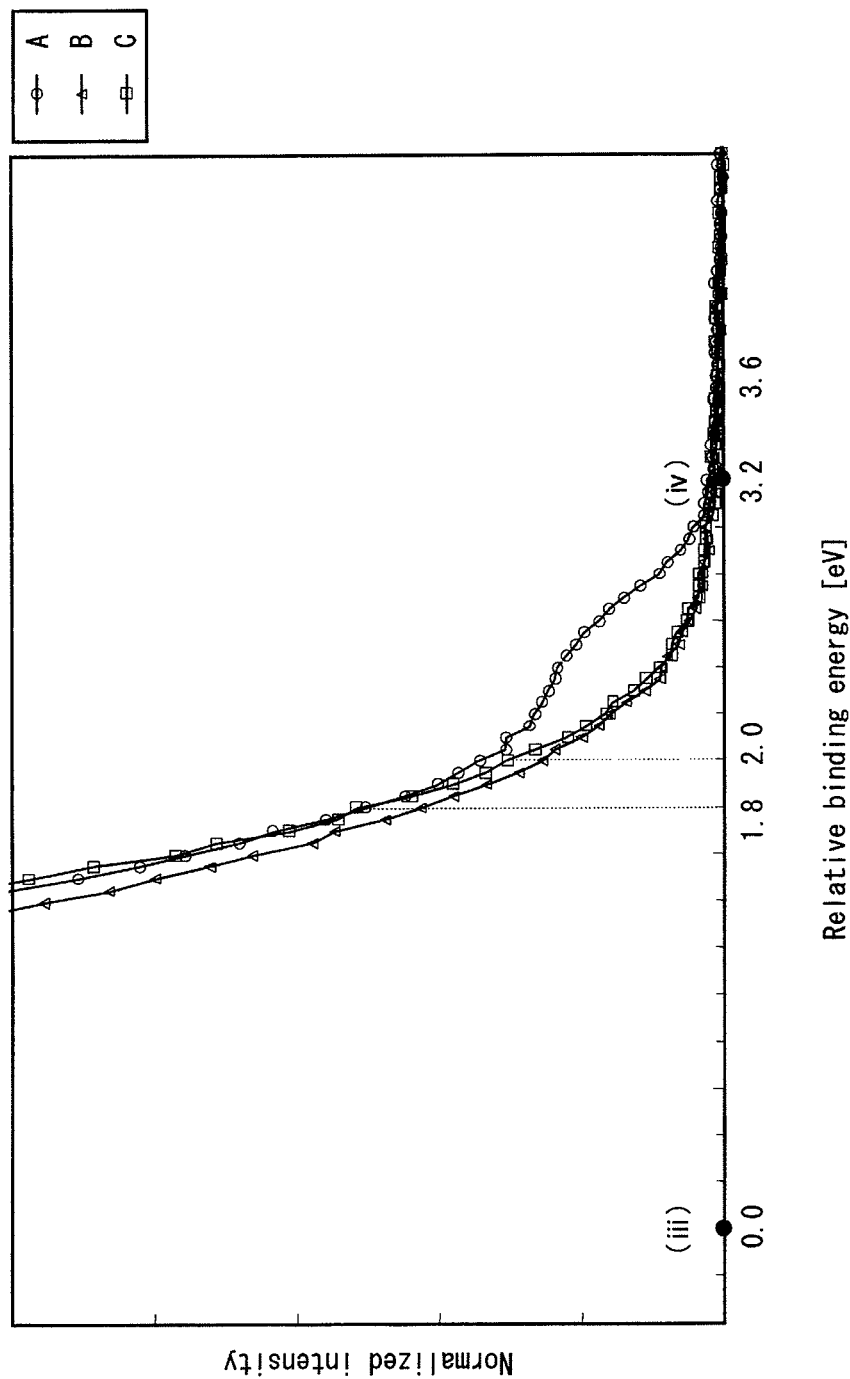
FIG. 9 illustrates UPS spectra of tungsten oxide.

The subsequent FIG. 9 illustrates a UPS spectrum of the tungsten oxide layer 80 of each of the sample devices A, B, and C, particularly within area (y) in FIG. 8. The spectrum intensity indicated by the vertical axis in FIG. 9 has been normalized using the peak-top intensity value of a peak (ii) in FIG. 8, which is located approximately 3 eV to 4 eV to the high binding energy direction from point (iii). In addition, note that point (iii) in FIG. 9 is illustrated at the same point on the horizontal axis as in FIG. 8. In FIG. 9, the horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As illustrated in FIG. 9, the spectrum indicating the tungsten oxide layer 80 of the sample device A exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 80 of the sample device A is first obviously observed. That is, point (iv) is a point at which the peak begins. The existence of such a peak is not observed in the spectra corresponding to sample devices B and C.

The present invention uses, for forming the hole injection layer, tungsten oxide whose UPS spectrum indicates an upward protrusion (not necessarily a peak) in an area which is 1.8 eV to 3.6 eV lower in terms of binding energy than point (iii). Hence, the organic EL element of the present invention exhibits excellent hole injection efficiency.

Furthermore, it has been found that hole injection efficiency is enhanced to a greater extent when the upward protrusion exhibited in the UPS spectrum of the tungsten oxide layer 80 has a higher degree of sharpness. Therefore, it can be said that the area of the UPS spectrum which is between a point 2.0 eV lower than point (iii) and another point 3.2 eV lower than point (iii), in terms of binding energy, is particularly essential, since the upward protrusion is more prominent and has a sharper inclination compared to other areas of the UPS spectrum.

Note that, in the following description, the upward protrusion as observed in the UPS spectrum of the tungsten oxide layer 80 is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C indicated in FIG. 9. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 9, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 10:
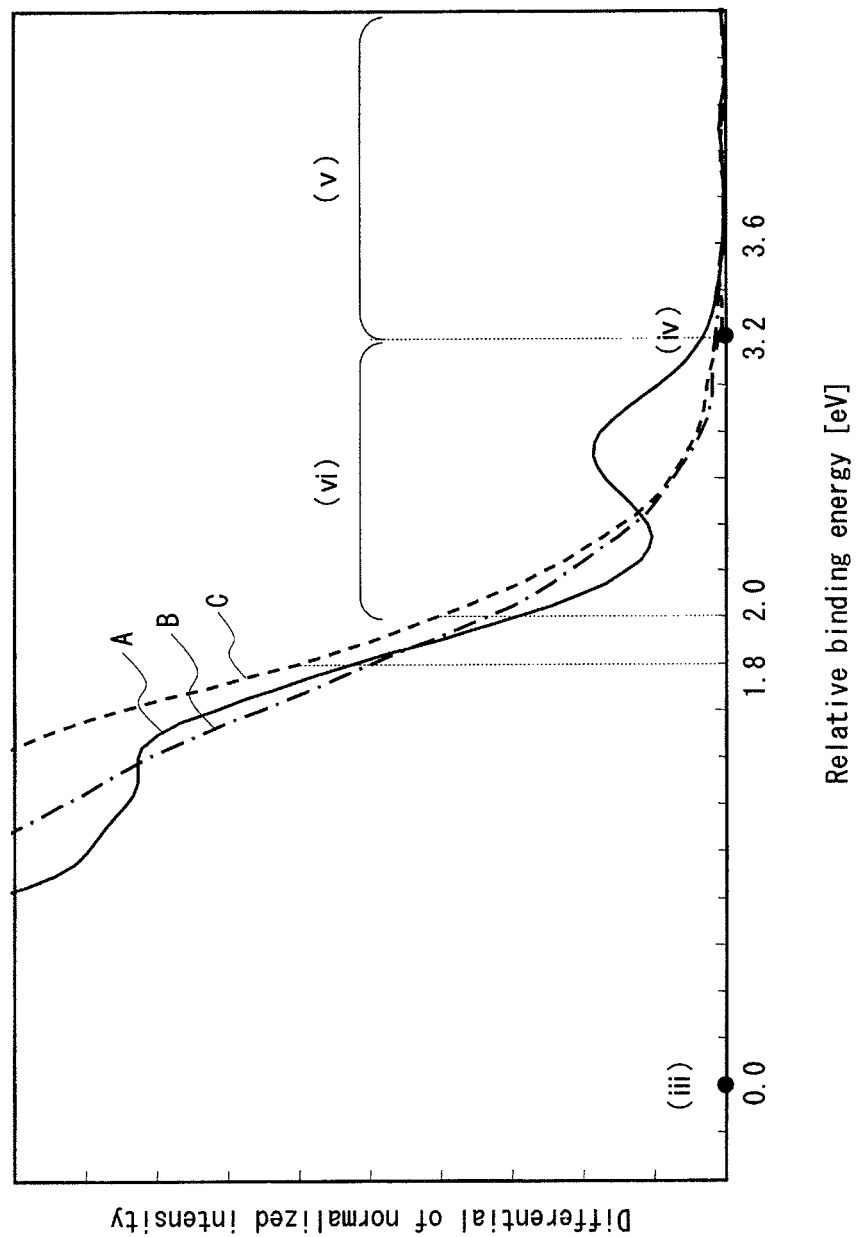
FIG. 10 illustrates differential curves corresponding to the respective UPS spectra illustrated in FIG. 9.

FIG. 10 illustrates differential curves yielded as a result of the above processing. Points (iii) and (iv) in FIG. 10 are provided at the same points on the horizontal axis as the respective points (iii) and (iv) in FIG. 9.

According to the differential curves illustrated in FIG. 10, the derivatives of normalized intensities of the tungsten oxide layers 80 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 9, from which the differential curves of FIG. 10 have been derived. Therefore, it can be said that the shapes of the UPS spectrum and the differential curve derived therefrom of each of sample devices B and C within areas (v) and (vi) resemble the shape of an exponential function curve.

Contrariwise, the differential curve corresponding to the tungsten oxide layer 80 of the sample device A in FIG. 10 exhibits a rapid rise from the vicinity of point (iv) towards the direction of point (iii). Thus, the shape of the differential curve corresponding to the tungsten oxide layer 80 of the sample device A within the areas (v) and (vi) clearly differs from the shape of an exponential function curve. Similarly, in FIG. 9, the spectrum corresponding to the tungsten oxide layer 80 of the sample device A, from which the differential curve in FIG. 10 corresponding to sample device A is derived, begins to protrude in the vicinity of point (iv). At the same time, it could also be seen that the spectrum in FIG. 9 exhibits a spectral protrusion near the Fermi surface, which is not found in a spectrum having the shape of an exponential function curve.

In other words, such a sample device A is characterized in that an occupied energy level near the Fermi surface is found in an area which is approximately 1.8 eV to 3.6 eV lower than the lowest energy level of a valence band of the hole injection layer, in terms of binding energy. More specifically, a spectral protrusion near the Fermi surface corresponding to the occupied energy level near the Fermi surface can be clearly seen in an area between a point which is approximately 2.0 eV lower than the lowest energy level of the valence band and another point which is approximately 3.2 eV lower than the lowest energy level of the valence band, in terms of binding energy, in the UPS spectrum corresponding to the sample device A.

Figure 11:
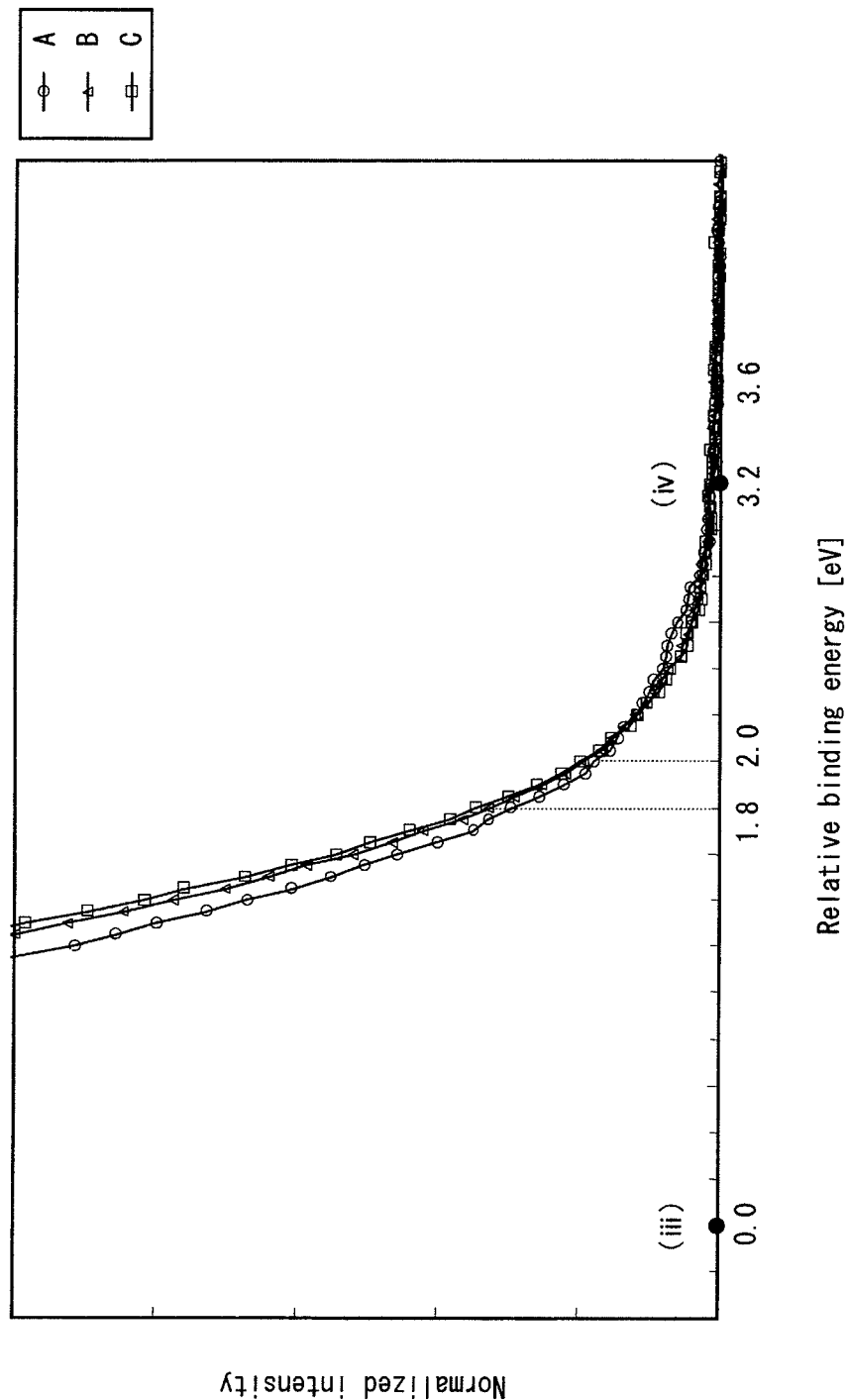
FIG. 11 illustrates UPS spectra of tungsten oxide that has been subjected to atmospheric exposure.

Next, the inventors conducted atmospheric exposure of the tungsten oxide layer 80 of each of the sample devices A, B, and C for a period of one hour at normal temperature. Note that the sample devices A, B, and C are the same sample devices as used in conducting the UPS measurement to obtain the UPS spectra in FIG. 9, and therefore have not been exposed to the atmosphere since the forming of the tungsten oxide layer 80. Following atmospheric exposure, the inventors conducted UPS measurement once again with respect to the tungsten oxide layer 80 of each of the sample devices A, B, and C. Observation was conducted focusing on the changes in the UPS spectrum corresponding to each of the sample devices A, B, and C. FIG. 11 illustrates UPS spectra which correspond to the sample devices A, B, and C within the area (y) in FIG. 8. The horizontal axis in FIG. 11 is similar to the horizontal axis in FIG. 9, and points (iii)) and (iv) in FIG. 11 are provided at the same points on the horizontal axis as the respective points (iii) and (iv) in FIG. 9.

According to the UPS spectra illustrated in FIG. 11, the tungsten oxide layer 80 of each of the sample devices B and C do not exhibit the spectral protrusion near the Fermi surface. Thus, it has been seen that the UPS spectra corresponding to the sample devices B and C do not exhibit the spectral protrusion both before or after atmospheric exposure. Contrariwise, it can be seen that the tungsten oxide layer 80 of the sample device A still exhibits the spectral protrusion near the Fermi surface, although the spectrum differs in intensity and shape when compared to before atmospheric exposure. Hence, it is observed that the tungsten oxide layer 80 of the sample device A maintains the same characteristics as before atmospheric exposure, even after conducting exposure thereof to the atmosphere for a certain period of time. Therefore, it can be concluded that the tungsten oxide layer 80 of the sample device A has a certain level of stability with respect to ambient atmosphere.

In the above, description has been provided regarding the sample devices A, B, and C with focus on the respective UPS spectra obtained as a result of UPS measurement. However, it should be noted that the existence of the spectral protrusion near the Fermi surface is to be similarly observed when applying an XPS measurement or a hard X-ray photoemission spectroscopy measurement.

Figure 12:
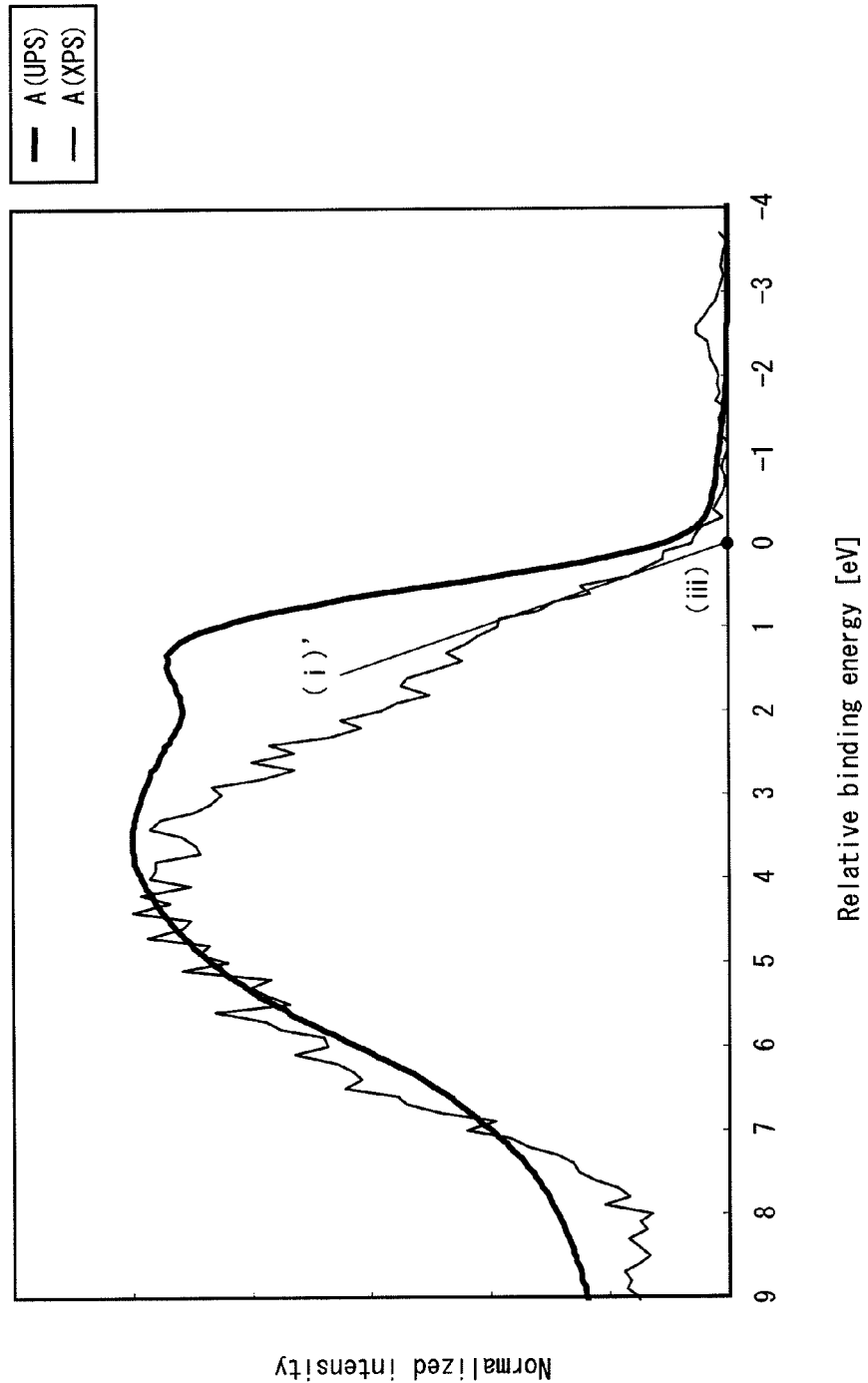
FIG. 12 illustrates both a UPS spectrum and an XPS spectrum of tungsten oxide pertaining to the present invention.

FIG. 12 illustrates an XPS spectrum of the tungsten oxide layer 80 of the sample device A after atmospheric exposure thereof. Note that, in FIG. 12, the XPS spectrum is overlaid with a UPS spectrum of the tungsten oxide layer 80 of the sample device A (the same UPS spectrum as illustrated in FIG. 8), so as to enable comparison between the two spectra.

The conditions under which the XPS measurement was conducted are similar to the conditions under which the UPS measurement was conducted as already described in the above, differing only in that an Al-K alpha line was used as the light source. In FIG. 12, point (iii) is provided at the same point on the horizontal axis as point (iii) in FIG. 8, and further, the horizontal axis indicates a relative binding energy with respect to point (iii). In addition, a line in the XPS spectrum corresponding to the line (i) in FIG. 8 is illustrated as line (i)' in FIG. 12.

As illustrated in FIG. 12, the spectral protrusion near the Fermi surface of the tungsten oxide layer 80 of the sample device A is found in the XPS spectrum, as well as in the UPS spectrum. In detail, in the XPS spectrum of the tungsten oxide layer 80 of the sample device A, the spectral protrusion near the Fermi surface is exhibited as a protrusion of a considerable degree within an area between a point which is approximately 1.8 eV lower than the lowest energy level of a valence band of the hole injection layer and another point which is 3.6 eV lower than the lowest energy level of the valence band of the hole injection layer, in terms of binding energy. Further, the spectral protrusion near the Fermi surface was similarly found when a hard X-ray photoemission spectroscopy measurement was conducted.

In the above, the sample device 1A (illustrated in FIG. 7) was used, instead of the organic EL element 1000 which is illustrated in FIG. 1, as the sample device for conducting the photoelectron spectroscopy measurements. The sample device 1A has a structure which differs from the organic EL element 1000, and is formed by disposing a tungsten oxide layer 80 on the conductive silicon substrate 70. Here, it should be noted that this measure has been taken merely for the sake of preventing the occurrence of charge-up, and thus, the structure of the organic EL element pertaining to the present invention is not to be limited thereby.

According to another experiment conducted by the inventors of the present invention, when UPS measurement and XPS measurement were conducted against a sample device having the structure of the organic EL element 1000 as illustrated in FIG. 1 (the structure where the anode 2 composed of ITO and the hole injection layer 4 composed of tungsten oxide are formed in the stated order on one surface of the substrate 1), the occurrence of charge-up was encountered during the measurements.

However, by using a neutralizing electron gun in such measurements, the occurrence of charge-up can be inhibited. When the neutralizing electron gun was used, there were cases where the absolute value of the binding energy indicated by each of the occupied energy levels of the hole injection layer 4 (for instance, the binding energy value when the Fermi surface of the photoelectron spectroscopy device itself is determined as the reference point) differed from the corresponding value of the tungsten oxide layer 80 of the sample device 1A. However, a spectrum having a similar shape as the spectrum of the sample device 1A was obtained, at least within an area extending from the band gap energy level to the lowest energy level of the valence band, in terms of binding energy.

(Analysis Concerning Hole Injection Efficiency)

The principle of the effect that the existence of the occupied energy level near the Fermi surface in the hole injection layer composed of tungsten oxide has on hole injection efficiency can be explained as provided in the following. Note that the existence of the occupied energy level near the Fermi surface is to be observed as a spectral protrusion near the Fermi surface in, for instance, a UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from oxygen vacancy or a structure similar thereto.

More specifically, assumption has been made that the existence of the occupied energy level near the Fermi surface derives from a binding orbital formed by 5d orbitals of adjacent tungsten atoms due to oxygen atom vacancy or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 2). Here, explanation is provided concerning molybdenum oxide since molybdenum oxide has many common physical properties similar to those of tungsten oxide, such as a catalyst effect, electrochromism, and photochromism.

Further in detail, the inventors of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 13:
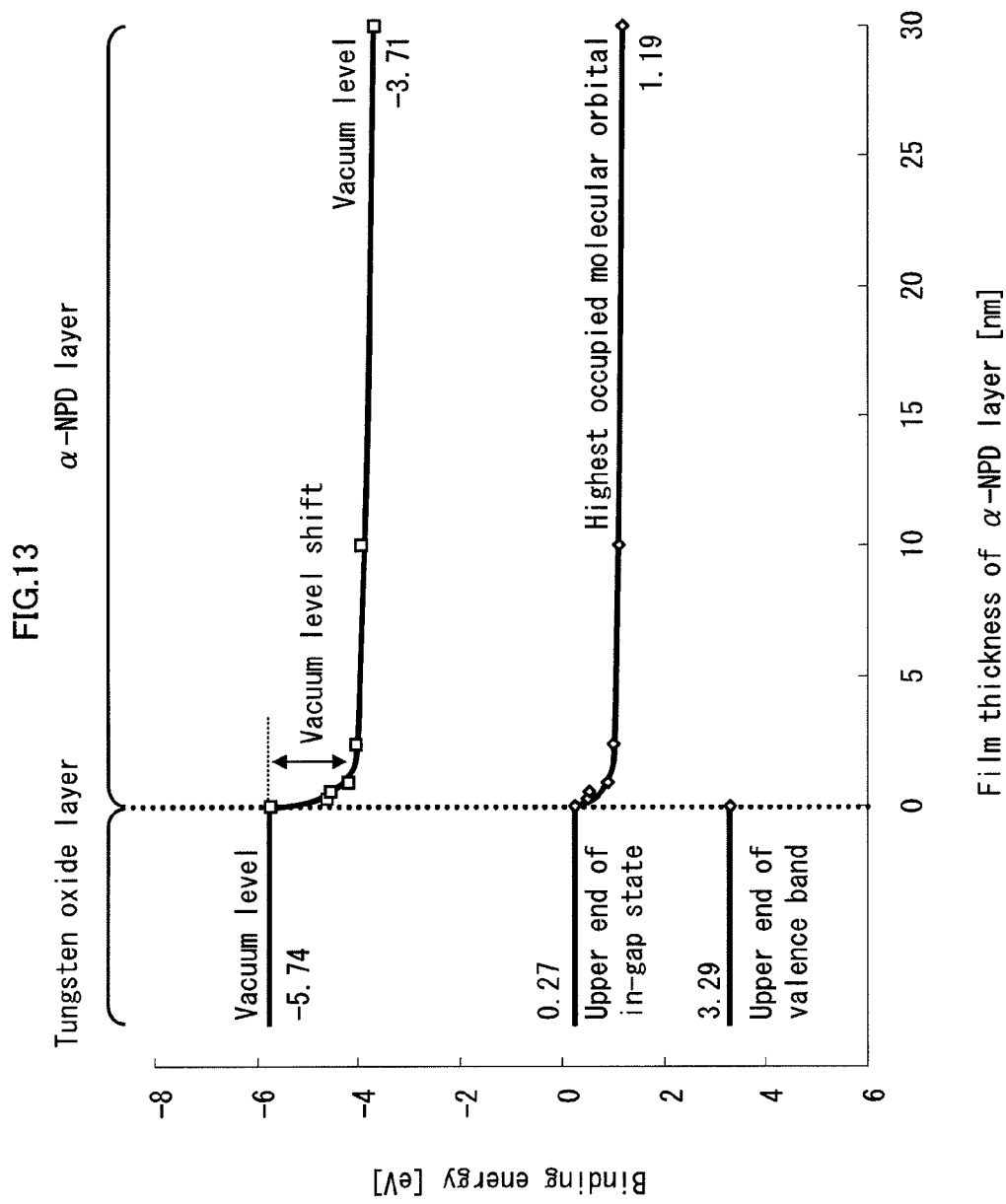
FIG. 13 is a diagram illustrating an energetic state at an interface between the tungsten oxide and α-NPD.

FIG. 13 is a diagram illustrating an energetic state at an interface between the tungsten oxide layer having the occupied energy level near the Fermi surface and an α-NPD layer.

FIG. 13 illustrates, with regards to the tungsten oxide layer (corresponding to the hole injection layer), the lowest binding energy of the valence band (illustrated as "upper end of the valence band" in FIG. 13) and the binding energy at the point at which the spectral rise near the Fermi surface begins (illustrated as "upper end of in-gap state" in FIG. 13). Seen in relation to the UPS spectrum of the tungsten oxide layer, the upper end of the valence band in FIG. 13 corresponds to point (iii) in FIG. 8, and the upper end of the in-gap state in FIG. 13 corresponds to point (iv) in FIG. 9.

In addition, FIG. 13 illustrates a thickness of the α-NPD layer and a binding energy of the HOMO of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the HOMO of the α-NPD layer corresponds to the binding energy at a point at which a peak of binding energy corresponding to the HOMO begins in the UPS spectrum of the α-NPD layer.

More specifically, the energy diagram illustrated in FIG. 13 is obtained through repeated alternate execution of the UPS measurement and the ultra high vacuum vapor deposition, where the tungsten oxide layer formed on the ITO substrate is transferred back and forth between a photoelectron spectroscopy device and an ultra high vacuum vapor deposition device connected to the photoelectron spectroscopy device. Since the occurrence of charge-up was not encountered during the UPS measurement, the binding energy on the vertical axis in FIG. 13 is indicated as an absolute value taken with respect to a reference point, which is the Fermi surface of the ITO substrate.

It could be seen in FIG. 13 that, at least within a 0-0.3 nm distance from the surface of the α-NPD layer facing the tungsten oxide layer, or that is, in a vicinity of the interface between the tungsten oxide layer and the α-NPD layer, the upper end of the in-gap state of the tungsten oxide layer and the HOMO of the α-NPD layer are substantially equivalent in terms of binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 13 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large at around 2 eV, it could be reasonably assumed that the EDL has been formed as a result of some type of effect that is similar to a chemical bond. Thus, it can be reasonably assumed that the interface energy level alignment has been formed as a result of interaction between the tungsten oxide and the α-NPD.

Further, the inventors of the present invention assume that the interaction, in specific, is caused by a mechanism as described in the following.

First of all, the occupied energy level near the Fermi surface derives from the 5d orbital of a tungsten atom, as description has already been made in the above. In the following, the 5d orbital of the tungsten atom is referred to as a "W5d orbital corresponding to the spectral protrusion".

When the HOMO of an α-NPD molecule approaches the W5d orbital corresponding to the spectral protrusion at the surface of the tungsten oxide layer, an electron transfers from the HOMO of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface between the tungsten oxide layer and the α-NPD layer, which brings about a vacuum level shift and an interface energy level alignment.

More specifically, many reports have been made, as a result of first principles calculations, that the HOMO of an α-NPD molecule is characterized in that: (i) the probability density thereof exhibits an uneven distribution of the HOMO near a nitrogen atom in an amine structure of the α-NPD molecule; and thus, (ii) the structure thereof includes, as the main composing element, a lone pair of electrons of a nitrogen atom. According to this, it could be assumed that, at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

The fact that there are reports made of interface energy level alignments, similar to the interface energy level alignment between the tungsten oxide layer and the α-NPD layer illustrated in FIG. 13, at interfaces formed between a vapor deposition film of molybdenum oxide and each of α-NPD and F8BT supports this assumption (refer to Non-Patent Literatures 3, 4, and 5). Note that molybdenum oxide has a physical property similar to tungsten oxide, as description has already made in the above, and further, α-NPD and F8BT are commonly organic amine-containing molecules.

The excellent hole injection efficiency of the hole injection layer of the organic EL element pertaining to the present invention can be explained according to the interface energy level alignment as described in the above. That is, an interface energy level alignment occurs between the hole injection layer composed of tungsten oxide that has the occupied energy level near the Fermi surface and the adjacent functional layer. As a result, the binding energy at the point at which the spectral protrusion corresponding to the occupied energy level near the Fermi surface begins and the binding energy of the HOMO of the functional layer become substantially equivalent. The injection of holes takes place between such energy levels having the interface energy level alignment formed therebetween. Therefore, the hole injection barrier to be overcome when injecting holes to the HOMO of the functional layer is minimized to such an extent as could be ignored.

However, as description has been already provided in the above, the occupied energy level near the Fermi surface is formed by factors such as oxygen vacancy and structures similar thereto, and further, it is quite unlikely, in reality, that tungsten oxide exists that is completely free of all such factors. Hence, for instance, it can be reasonably assumed that, even in such tungsten oxide as used to prepare the above-mentioned sample devices B and C, which does not exhibit the spectral protrusion near the Fermi surface in the photoelectron spectroscopy spectrum, oxygen vacancy and structures similar thereto exist, however minimal they may be in terms of number.

In view of this, hereinafter, explanation is provided, with reference to FIG. 14, of the reason for which the hole-only device HOD-A and the organic EL element BPD-A, both having the hole injection layer 4 which corresponds to the tungsten oxide layer 80 of the sample device A, exhibit excellent hole injection efficiency as observed through the above experiments.

To bring about the interaction between the HOMO of the organic molecule composing the functional layer and the occupied energy level near the Fermi surface of the tungsten oxide layer when disposing the functional layer on the tungsten oxide layer, the following condition needs to be fulfilled. That is, a portion of the organic molecule where the probability density of the HOMO is high, and an oxygen vacancy or a structure similar thereto of the tungsten oxide layer (illustrated as "injection site (x)" in FIG. 14) must approach each other to a distance at which the interaction is triggered (fall into contact with each other). The portion of the organic molecule where the probability density of the HOMO is high (illustrated as "injection site (y)" in FIG. 14) is, for instance, a nitrogen atom in the amine structure of an organic amine-containing molecule.

Figure 14A:
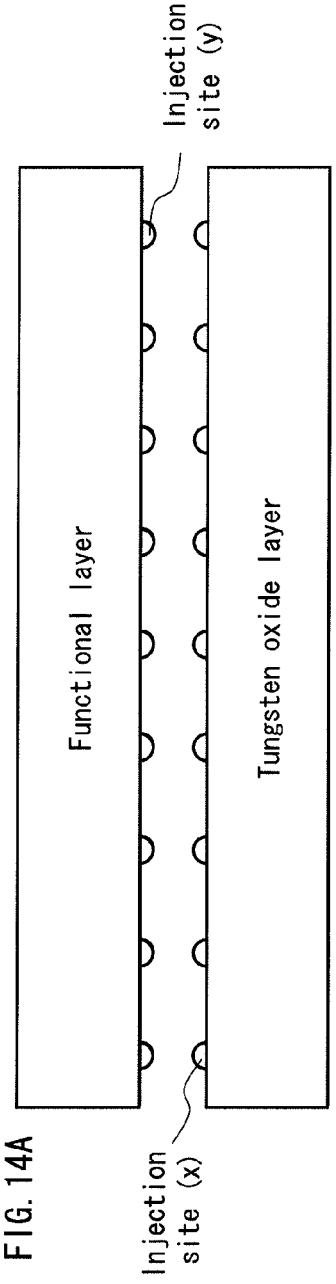
FIGS. 14A and 14B are diagrams for explanation of effects yielded by injection sites of the hole injection layer and a functional layer.
Figure 14B:
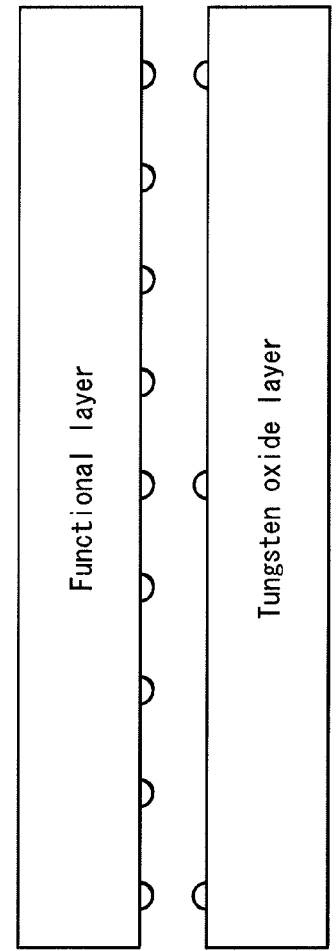

However, in a tungsten oxide layer as incorporated in the sample devices B and C, the number density of the injection site (x), if any, is extremely small, as illustrated in FIG. 14B. Accordingly, the upward protrusion near the Fermi surface does not appear in the UPS spectra thereof. Thus, the possibility of the injection site (x) and the injection site (y) falling into contact is extremely low. Since the injection of holes takes place where the injection site (x) and the injection site (y) fall into contact, it is clear that hole injection efficiency in sample devices B and C is extremely low.

In contrast to this, an abundance of injection sites (y) exists in the tungsten oxide layer which exhibits the spectral protrusion near the Fermi surface, as illustrated in FIG. 14A. Note that the tungsten oxide layer exhibiting the spectral protrusion near the Fermi surface is, for instance, the tungsten oxide layer incorporated in the above-mentioned sample device A. Thus, there is a high possibility of the injection sites (y) and the injection sites (x) falling into contact, and therefore the tungsten oxide layer exhibits excellent hole injection efficiency.

When summarizing the description provided in the above, the excellent hole injection efficiency of the organic EL element pertaining to the present invention can be explained as follows.

Firstly, a hole injection layer composed of tungsten oxide exhibits, in the photoelectron spectroscopy spectrum thereof, an upward protrusion near the Fermi surface. Such a spectral protrusion near the Fermi surface is indicative of a considerable number of oxygen vacancies and structures similar thereto existing at the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital (HOMO) of the organic molecule.

As such, if a considerable number of oxygen vacancies and structures similar thereto is found at the surface region of the hole injection layer, the possibility increases of the occupied energy level near the Fermi surface and a portion of the organic molecule having a high probability density of the HOMO falling into contact with each other. Thus, the interface energy level alignment occurs efficiently, and accordingly, the tungsten oxide layer exhibits excellent hole injection efficiency.

(Film Loss of the Hole Injection Layer)

In order to assess the characteristics of the organic EL element after the formation of the banks, the inventors of the present invention manufactured a new organic EL element 1000 (FIG. 1) aside from the above assessment devices (from which the banks 5 are omitted) and conducted an experiment. The new organic EL element 1000 includes the banks 5. As a result of the experiment, the inventors confirmed that the organic EL element 1000 can be driven at a low voltage like the above assessment devices, and the light-emitting characteristics of the organic EL element 1000 are improved.

When the inventors of the present invention examined the manufactured organic EL element, the inventors found that the thickness of a hole injection layer of the organic EL element decreased (hereinafter, a decrease of the layer is referred to as "film loss") compared with the thickness observed immediately after the hole injection layer was formed. The inventors assumed that the film loss of the hole injection layer occurs during the formation of the banks. As such, the following experiment was conducted in order to find the cause of the film loss of the hole injection layer.

In specific, a layer composed of tungsten oxide was formed first as a hole injection layer on a glass substrate via sputtering (this layer was formed under the same film forming conditions as the hole-only device). Further, a resin material layer was formed by layering predetermined resin material (series of "TFRs" manufactured by TOKYO OHKA KOGYO Co., Ltd.) on the hole injection layer via spin coating (at room temperature, 2500 rpm/25 sec) and by baking the layered material (100° C., 90 sec). Subsequently, development (with use of 2.38% TMAH solution, developing time is 60 sec) and cleaning (with use of pure water, cleaning time is 60 sec) were conducted. Subsequently, the resin material layer was removed. These processes of providing the resin material layer, development, and cleaning are assumed to be the actual process of forming the banks.

Figure 15:
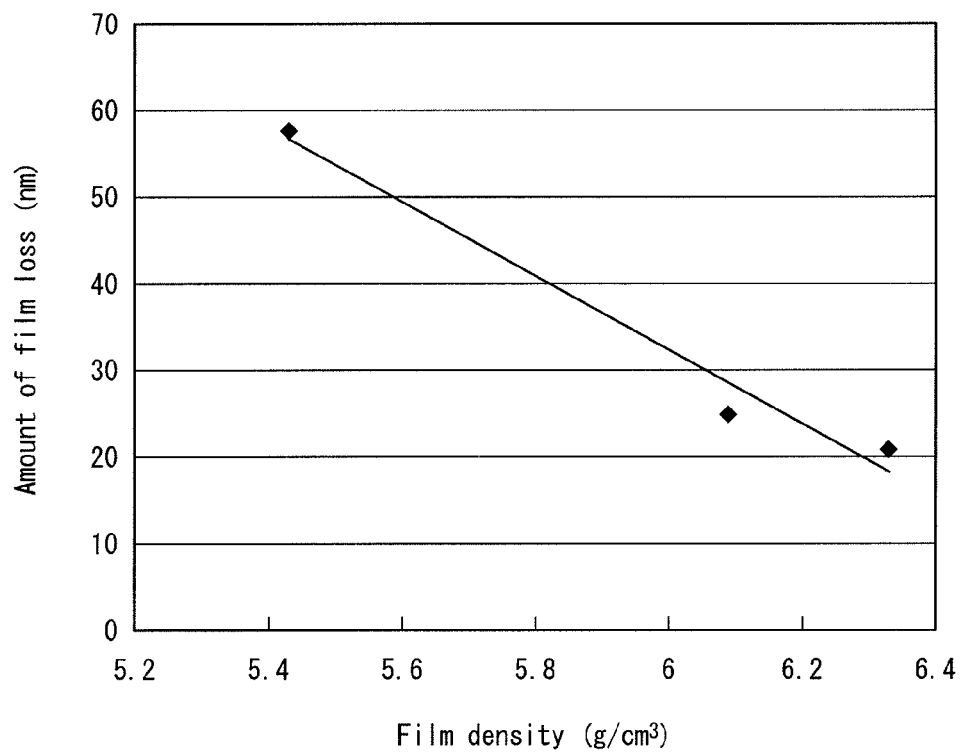
FIG. 15 is a graph showing a relation between an amount of film loss and film density of the hole injection layer.

Conditions and results for such an experiment will be presented in Table 5. Also, FIG. 15 is a graph showing a relation between an amount of film loss and film density shown in Table 5.

TABLE 5

| | Sample Device | | |
|---|---|---|---|
| | Sample Device A | Sample Device B | Sample Device C |
| Total Pressure (Pa) | 4.8 | 2.7 | 2.7 |
| Ar:O$_2$ | 100:100 | 43:100 | 43:100 |
| Input Power (W) | 250 | 500 | 1000 |
| Film Density (g/cm$^3$) | 5.43 | 6.09 | 6.33 |
| Film Loss (nm) | 57.7 | 25 | 20.9 |
| Notes/Film-Forming Apparatus | SMD | SOLCIET | SOLCIET |

According to the experimental results shown in Table 5, the thickness of the tungsten oxide layer, which is a hole injection layer, ultimately became approximately 23 nm. This is smaller than the thickness of the tungsten oxide layer observed immediately after the tungsten oxide layer was formed, i.e., 80 nm. Hence, it was confirmed that approximately 57 nm of tungsten oxide layer was lost (see Sample Device A having the most excellent characteristics).

Further, as demonstrated in FIG. 15, film density of the tungsten oxide layer greatly relates to an amount of film loss of the tungsten oxide layer. That is, as the film density decreases, the amount of film loss increases.

Although the exact reason for this relation remains unknown at present, according to Tables 4 and 5 and the graph shown in FIG. 15, the tungsten oxide layer has lower film density as film characteristics such as light-emitting characteristics is more excellent. Further, another study conducted by the inventors of the present invention revealed that film density of the tungsten oxide layer lowers by having therein structures with oxygen vacancies, which guarantees excellent hole-injection properties of the tungsten oxide layer. Based on the result of this study, it can be estimated that such excellent hole-injection properties enable the organic EL element to be driven at a low voltage.

In addition, the inventors of the present invention inquired into the causes of film loss of the tungsten oxide layer, and ascertained that the tungsten oxide layer is dissolved by a solvent used in development or cleaning and the film of the tungsten oxide is lost. As described above, the film density of the tungsten oxide layer having the structures with oxygen vacancies is low. Presumably, this is because a number of fine crystal structures are formed in the tungsten oxide layer. It could be assumed that due to a number of fine crystal structures thus formed, a solvent (developer, cleaning liquid, etc.) used to prepare a film during the formation of the banks easily enters the tungsten oxide layer, thereby causing film loss.

In general, there is a concern that the above-mentioned film loss might make it difficult to manage the thickness of the tungsten oxide layer and have some effect on hole-injection properties of the tungsten oxide layer of the completed organic EL element. Hence, if people skilled in the art are aware of the occurrence of such film loss of the hole injection layer, it is assumed that they will hesitate to form the hole injection layer by using tungsten oxide.

Intensive studies by the inventors of the present invention on this problem, however, have revealed that the film loss of the tungsten oxide layer can be adjusted by appropriately changing developing conditions (i.e., by reducing concentration of developer from 2.38% to approximately 0.2%) or baking conditions, for example. According to this, the thickness of the tungsten oxide layer can be controlled while taking the film loss of the tungsten oxide layer into account. Furthermore, the inventors of the present invention performed a study on an experimental model of a more realistic light-emitting element based on such a technology of controlling an amount of film loss of the hole injection layer, and confirmed the following technical matters.

The steps of manufacturing of the experimental model of the light-emitting element were first to form a hole injection layer composed of tungsten oxide on an anode, and then to form a bank material layer on the hole injection layer. Subsequently, the bank material layer was patterned in a predetermined shape having an aperture in which functional layers were to be formed (during patterning, banks are exposed, developed and cleaned). Subsequently, the functional layers were formed at a position corresponding to the aperture. On the functional layers, a cathode was formed.

When the inventors of the present invention examined the organic EL element manufactured in this method, the inventors found that tungsten oxide was dissolved to become a concavity at a position corresponding to the aperture of the hole injection layer, and accordingly, the hole injection layer, as a whole, was configured to have concave structures.

In addition, the inventors have reached a finding that when the hole injection layer has a concave structure and the light-emitting element with this structure is driven, the electric field occurring between the anode and the cathode concentrates at edge of the concave structure of the hole injection layer, i.e., near the end portion of the aperture, and such concentration of the electric field might damage the light-emitting characteristics, causing problems such as the unevenness in luminance or a decrease in service life of the light-emitting element.

As such, the inventors of the present invention conceived of the structure shown in the following embodiment. According to this structure, defects due to concentration of the electric field at the edge of such concave structure can be avoided by modifying the shape of the banks.

The following is a description of another embodiment of the present invention, focusing on the differences with Embodiment 1.

Embodiment 2

(Overall Structure of the Organic EL Display)

Figure 17:
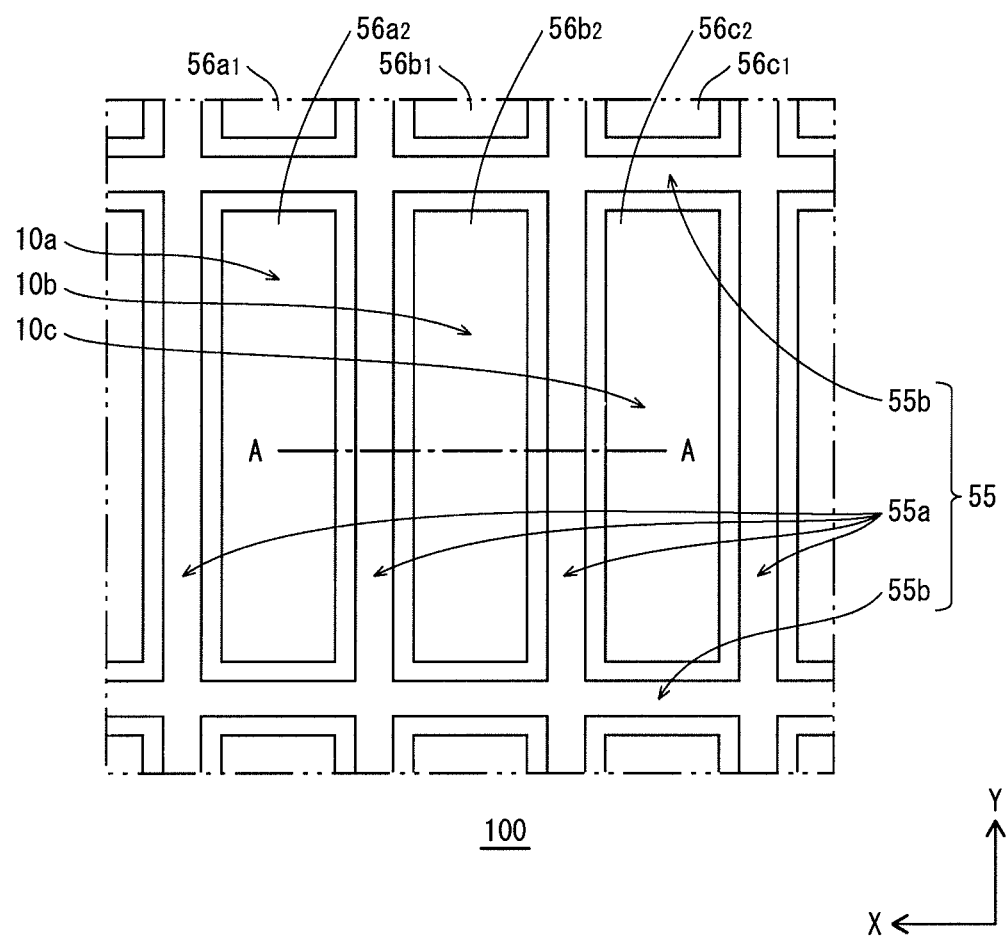
FIG. 17 is a plan view showing a part of an organic EL display in Embodiment 2 of the present invention.

FIG. 17 is a plan view showing a part of an organic EL display according to Embodiment 2 of the present invention.

A organic EL display 100 is a top-emission type organic EL display composed of organic EL elements 10a, 10b, and 10c arranged in a matrix and each provided with a light emitting layer having a color of either red (R), green (G), or blue (B). Each of the organic EL elements 10a, 10b, and 10c corresponds to the organic EL element 1000 in Embodiment 1. Each organic EL element functions as a sub-pixel, and three consecutive organic EL elements of colors of RGB function as a pixel as a whole.

In an example of FIG. 17, a pixel bank 55 having a lattice shape is adopted. Each bank element 55a extending along a Y axis delimits consecutive light-emitting layers 6B6a1, 56b1, and 56c1 arranged along an X axis as well as consecutive light-emitting layers 6B6a2, 56b2, and 56c2 arranged along the X axis.

On the other hand, a bank element 55b extending along the X axis delimits adjacent light-emitting layers 6B6a1 and 56a2 arranged along the Y axis, adjacent light-emitting layers 6B6b1 and 56b2 arranged along the Y axis, and adjacent light-emitting layers 6B6c1 and 56c2 arranged along the Y axis.

Figure 18:
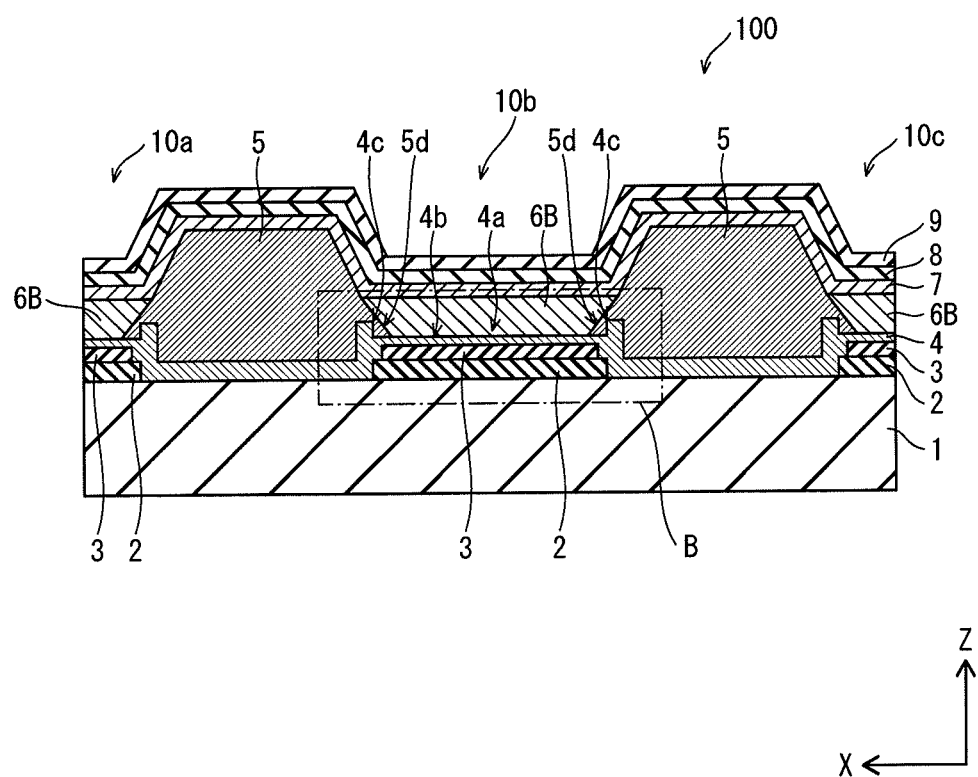
FIG. 18 is an end elevation schematically showing a cross section of the part of the organic EL display in Embodiment 2 of the present invention.
Figure 19:
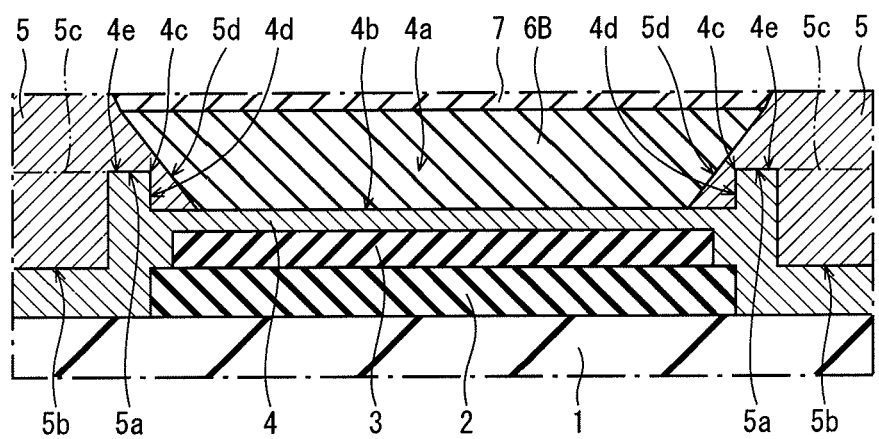
FIG. 19 is an enlarged end elevation of a portion B enclosed by an alternate long and short dash line of FIG. 18.

FIG. 18 is an end elevation schematically showing a cross section of a part of the organic EL display in embodiment of the present invention taken along the line A-A of FIG. 17. FIG. 19 is an enlarged end elevation of a portion B enclosed by an alternate long and short dash line of FIG. 18.

Each of the organic EL elements 10a, 10b, and 10c is different from the element 1000 pertaining to Embodiment 1 in that an ITO layer 3 is provided between the hole injection layer 4 and the anodes 2, the buffer layer 6A is not provided, an electron injection layer 7 is provided on the light-emitting layer 6B, and a passivation layer 9 is provided on the cathode 8.

On the substrate 1, the anodes 2 are formed in a matrix. On the anode 2, the ITO (indium tin oxide) layer 3 and the hole injection layer 4 are laminated in the stated order. Note that, while the ITO layer 3 is laminated only on the anode 2, the hole injection layer 4 is formed not only on the anode 2 but also over the substrate 1.

The ITO layer 3 exists between the anode 2 and the hole injection layer 4 and has a function of guaranteeing excellent bondability between the anode 2 and the hole injection layer 4.

The bank 5 is formed above a periphery of the anode 2 via the hole injection layer 4. The light-emitting layer 6B is laminated in an area defined by the bank 5. On the light-emitting layer 6B, the electron injection layer 7, the cathode 8, and the passivation layer 9 are formed continuously across the consecutive organic EL elements 10a, 10b and 10c, passing over the bank 5.

The electron injection layer 7 has a function of transporting, to the light-emitting layer 6B, an electron injected from the cathode 8. It is preferable that the electron injection layer 7 be made from barium, phthalocyanine, fluorine lithium, or a combination of these materials.

The cathode 8 has a single layer structure formed from ITO, indium zinc oxide (IZO), etc. A top-emission type light-emitting element preferably includes the cathode 8 made of a light transparent material.

The passivation layer 9 has a function of preventing the light-emitting layer 6B and so on from being exposed to moisture and air. The passivation layer 9 is made from a material such as SiN (silicon nitride) and SiON (silicon oxynitride). A top-emission type light-emitting element preferably includes the passivation layer 9 made of a light-transmissive material.

(Hole Injection Layer)

The hole injection layer 4 is the same as that of Embodiment 1. The hole injection layer 4 is made of tungsten oxide (WOx) and formed under film forming conditions which resulted in excellent hole-injection properties. As shown in FIG. 19, the hole injection layer 4 extends laterally along bottom surfaces 5a and 5b of the bank 5, and has a recess 4a in an upper surface thereof. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. An upper peripheral edge 4c of the recess is a convex portion composed of (i) a part 4e of the upper surface of the hole injection layer 4 in which the recess is not formed and (ii) the inner side surface 4d of the recess. The upper peripheral edge 4c is covered with a covering part 5d, which is a part of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current occurs in the light-emitting layer 6B. As a result, the uneven luminance occurs in a light-emitting surface and a life of the organic EL element is reduced due to localized deterioration of the light-emitting layer 6B. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the light-emitting layer 6B) be 2 nm to 5 nm to effectively suppress the electric field concentration.

In an example of FIG. 19, the upper peripheral edge 4c of the recess has a right angle. The upper peripheral edge 4c of the recess, however, may have a plurality of angles, or may be curved. In such a case, the electrical field concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6B is formed using printing technology such as inkjet technology, ink is distributed to every corner of an area defined by the bank. As a result, formation of a void and the like is suppressed.

<Process by which an Aspect of the Present Invention was Achieved>

The following specifically explains the above description made in (Film Loss of the Hole injection layer) with reference to the drawings.

Figure 16A:
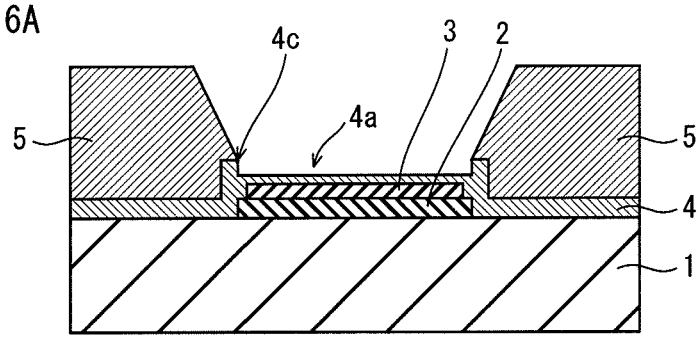
FIGS. 16A and 16B each show an end elevation to illustrate a technical problem of the conventional art.
Figure 16B:
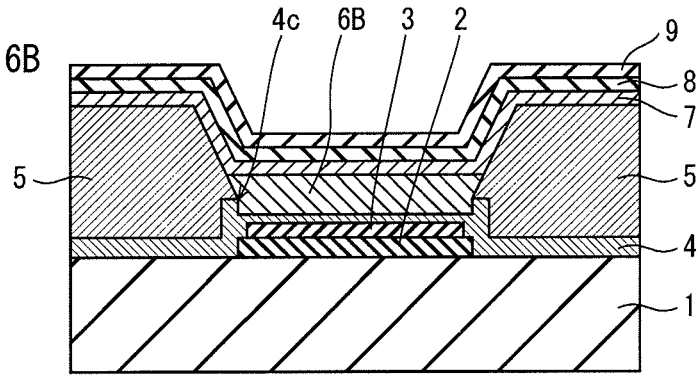

FIGS. 16A and 16B are each an end elevation showing a manufacturing process of an organic EL display. FIG. 16A shows a status in which the anode 2, the ITO layer 3, the hole injection layer 4, and the bank 5 are formed on a TFT substrate 1. FIG. 16B shows a status in which the light-emitting layer 6B, the electron injection layer 7, the cathode 8, and the passivation layer 9 are formed in addition to the components shown in FIG. 16A.

With the structure in which tungsten oxide is applied to a charge injection transport layer (the hole injection layer 4 in this example), a recess 4a is formed in an upper surface of the hole injection layer 4 (see FIG. 16A) in a process of fixating the bank 5. If the light-emitting layer 6B is formed with the recess 4a formed in the upper surface of the hole injection layer 4 (see FIG. 16B), an electric field concentrates in the vicinity of an upper peripheral edge 4c of the recess 4a when the organic EL display emits light. As a result, localized flow of current can occur in the light-emitting layer 6B. This might lead to the occurrence of uneven luminance in a light-emitting surface and reduce a life of the organic EL element due to localized deterioration of the light-emitting layer.

The above-described problems and knowledge are unique to an organic EL element to which tungsten oxide is applied, and have technical significance in terms of not having been revealed.

As described above, the inventor arrived at the following technical features through a series of research and studies. That is, by covering the upper peripheral edge of the recess formed in the upper surface of the charge injection transport layer including tungsten oxide with a part of the bank, concentration of charges in the vicinity of the upper peripheral edge of the recess is suppressed when an organic EL element emits light. As a result, localized flow of current is suppressed.

<Manufacturing Method of the Organic EL Display>

FIGS. 20A, 20B, 20C, 21A, 21B, 21C, 22A, 22B, and 22C are each a process chart showing a method of manufacturing the organic EL display in embodiment of the present invention.

Figure 20A:
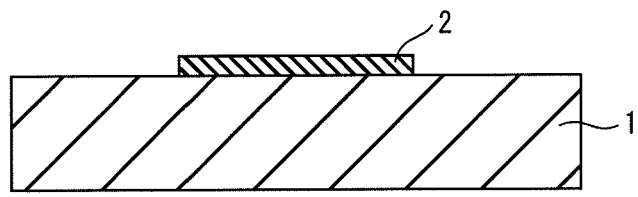
FIGS. 20A, 20B, and 20C are each a process chart showing a method of manufacturing the organic EL display in Embodiment 2 of the present invention.

At first, as shown in FIG. 20A, a thin Ag film is formed on the substrate 1 using a sputtering method. The formed thin Ag film is then patterned using photolithography or the like to form the anodes 2 in a matrix. Note that the thin Ag film may be formed using a vacuum evaporation method or the like.

Figure 20B:
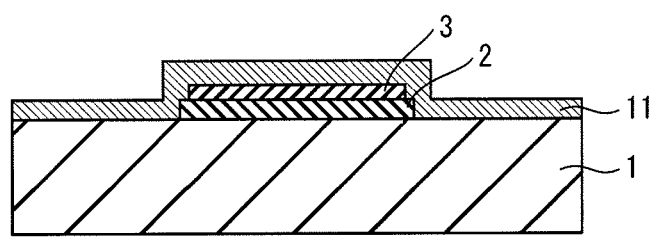

Next, as shown in FIG. 20B, a thin ITO film is formed using the sputtering method or the like. The formed thin ITO film is then patterned using the photolithography or the like to form the ITO layer 3. Then, a thin WOx film 11 or a thin MoxWyOz film 11 is formed from a composition containing WOx or MoxWyOz using technology such as vacuum evaporation and sputtering.

Figure 20C:
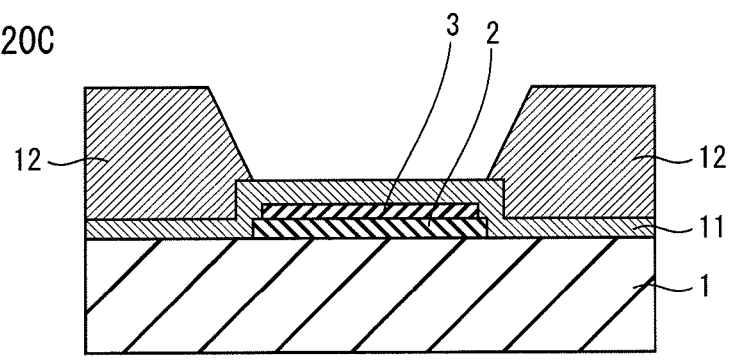

Next, as shown in FIG. 20C, a bank material layer 12 is formed on the thin film 11. A portion of the bank material layer 12 is removed so that the thin film 11 is partially exposed. The bank material layer 12 is formed by application or the like. The portion of the bank material layer 12 is removed by forming a resist pattern on the bank material layer 12, and then performing etching. The resist pattern is removed by an aqueous or non-aqueous release agent after the etching.

Figure 21A:
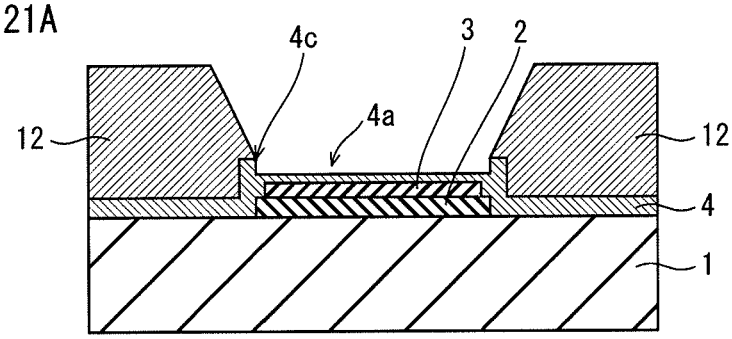
FIGS. 21A, 21B, and 21C are are each a process chart showing the method of manufacturing the organic EL display in Embodiment 2 of the present invention.

Next, residues remaining after the etching are removed by being washed with pure water. Here, WOx or MoxWyOz, which is a material for the thin film 11, is soluble in pure water. Therefore, as shown in FIG. 21A, an exposed portion of the thin film 11 is eroded, and a recess is formed. As a result, the hole injection layer 4 having the recess 4a is formed.

Figure 21B:
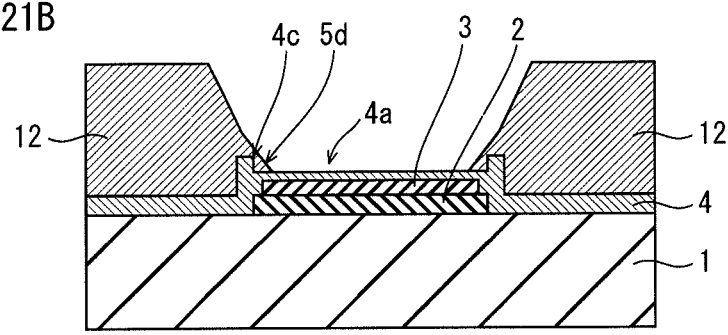

Next, as shown in FIG. 21B, the remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

Figure 21C:
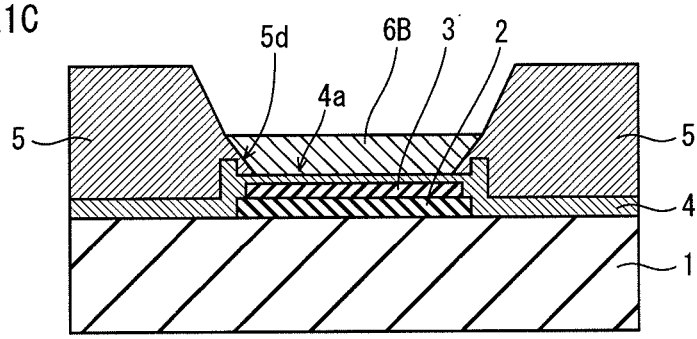

Subsequently, as shown in FIG. 21C, an ink composition including an organic EL material (hereinafter, simply referred to as "ink") is dropped in the area defined by the bank 5 by the inkjet method or the like. By drying the ink, the light-emitting layer 6B is formed. Note that the ink may be dropped by a dispenser method, a nozzle-coat method, a spin coat method, an intaglio printing, a letter press printing, or the like.

Figure 22A:
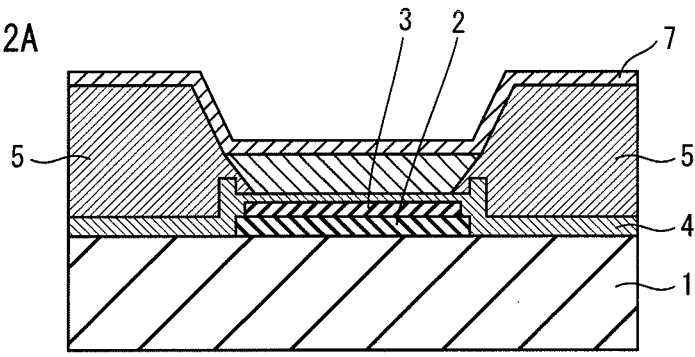
FIGS. 22A, 22B, and 22C are each a process chart showing the method of manufacturing the organic EL display in Embodiment 2 of the present invention.
Figure 22B:
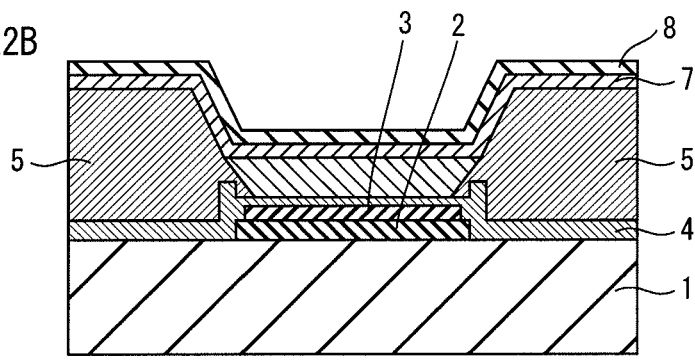
Figure 22C:
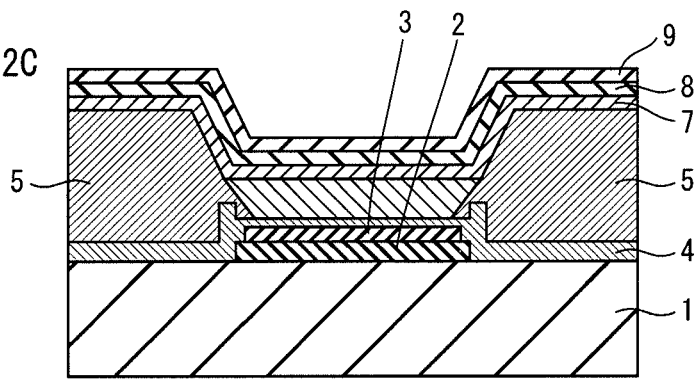

Next, as shown in FIG. 22A, a thin barium film as the electron injection layer 7 is formed using a vacuum evaporation method or the like. Then, as shown in FIG. 22B, a thin ITO film as the cathode 8 is formed using a sputtering method. As shown in FIG. 22C, the passivation layer 9 is further formed.

With the above-mentioned manufacturing method, even when the recess 4a is formed in an exposed portion of the hole injection layer 4 during manufacturing, the electrical field concentration in the vicinity of the upper peripheral edge 4c of the recess is suppressed because the upper peripheral edge 4c of the recess is covered with the covering part 5d and the light-emitting layer 6B is formed on the covering part 5d.

Although having been explained based on the above embodiment, the present invention is not limited to the above embodiment. For example, the following modifications can also be implemented.

(1) In the above embodiment, WOx or MoxWyOz is used as a material for the hole injection layer 4. In general, however, a metal oxide, a metal nitride, and a metal oxynitride are likely to be eroded by pure water. Therefore, even when a metal other than Mo (molybdenum) and W (tungsten) is used as a material for the hole injection layer 4, a similar effect is obtained by applying the present embodiment.

(2) In the above embodiment, the recess is formed by the hole injection layer being eroded by pure water during washing. However, an effect of suppressing the electrical field concentration in the vicinity of the upper peripheral edge of the recess is obtained even when the recess is formed in another manner, by applying the present invention. For example, the recess may be formed by the hole injection layer being eroded by etching solution during etching, or by the hole injection layer being eroded by a release agent during removal of the resist pattern. As described above, the present invention is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 23:
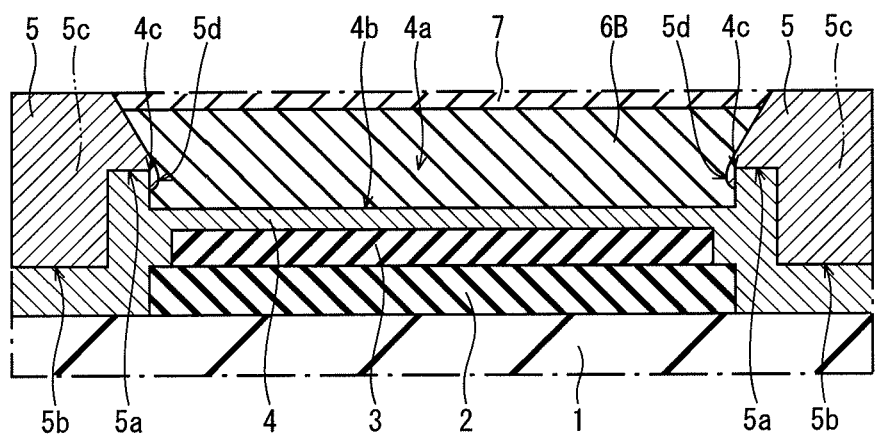
FIG. 23 is an end elevation schematically showing a cross section of a part of an organic EL display in Modification of the present invention.

(3) In the above embodiment, the covering part extending from the bank reaches the bottom 4b of the recess beyond the upper peripheral edge 4c of the recess. However, the present invention is not limited to the above as long as at least the upper peripheral edge 4c of the recess is covered. For example, as shown in FIG. 23, the covering part 5d may be out of contact with the bottom 4b of the recess. When the structure shown in FIG. 23 is adopted, the temperature and time of the heat treatment are reduced, as it is not necessary to extend the bank material to the bottom of the recess.

In the above embodiment, the recess 4a is formed in the hole injection layer 4 by washing after etching in the process of forming the bank. In the present invention, however, mask patterning or the like may be used as a method of forming the recess.

Figure 24A:
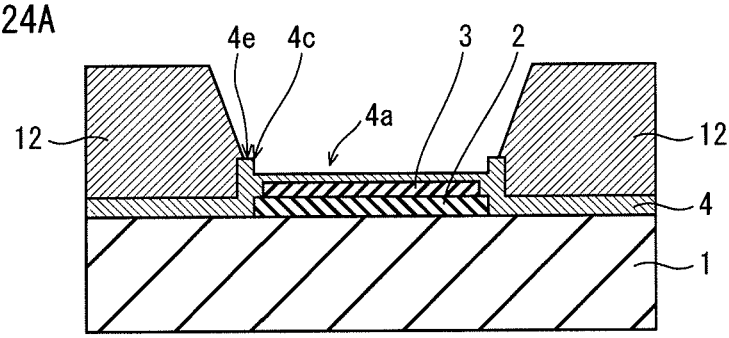
FIGS. 24A and 24B are each a process chart showing a method of manufacturing the organic EL display in Modification of the present invention.
Figure 24B:
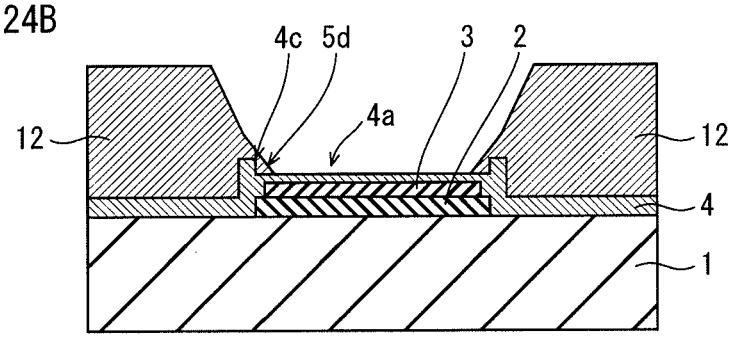

(4) In FIG. 21A, although a lower end of the slope of the bank material 12 coincides with the upper peripheral edge 4c of the recess, the structure of the bank material 12 is not limited to this. Depending on the bank material, the part 4e of the upper surface of the hole injection layer 4 in which the recess is not formed may be partially exposed by the slope of the bank material 12 being set back, as shown in FIG. 24A. In such a case, by appropriately heat treating the bank material 12, the upper peripheral edge 4c of the recess is covered with a part of the bank material (see FIG. 24B).

Figure 25:
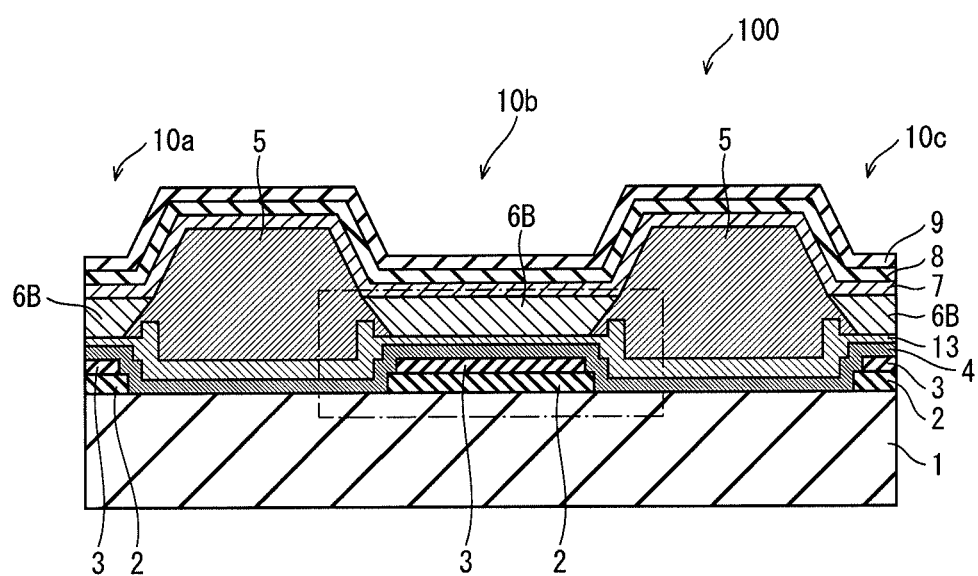
FIG. 25 is an end elevation schematically showing a cross section of a part of an organic EL display in Modification of the present invention.

(5) In the above embodiment, as the charge injection transport layer, only the hole injection layer 4 is interposed between the anode and the light-emitting layer. However, the present invention is not limited to the above. For example, as shown in FIG. 25, a hole transport layer 13 may be formed on the hole injection layer 4, and these layers may be interposed as the charge injection transport layer. In this case, the recess is formed in an upper surface of the hole transport layer 13, and an upper peripheral edge of the recess formed in the hole transport layer 13 is covered with the covering part.

Figure 27:
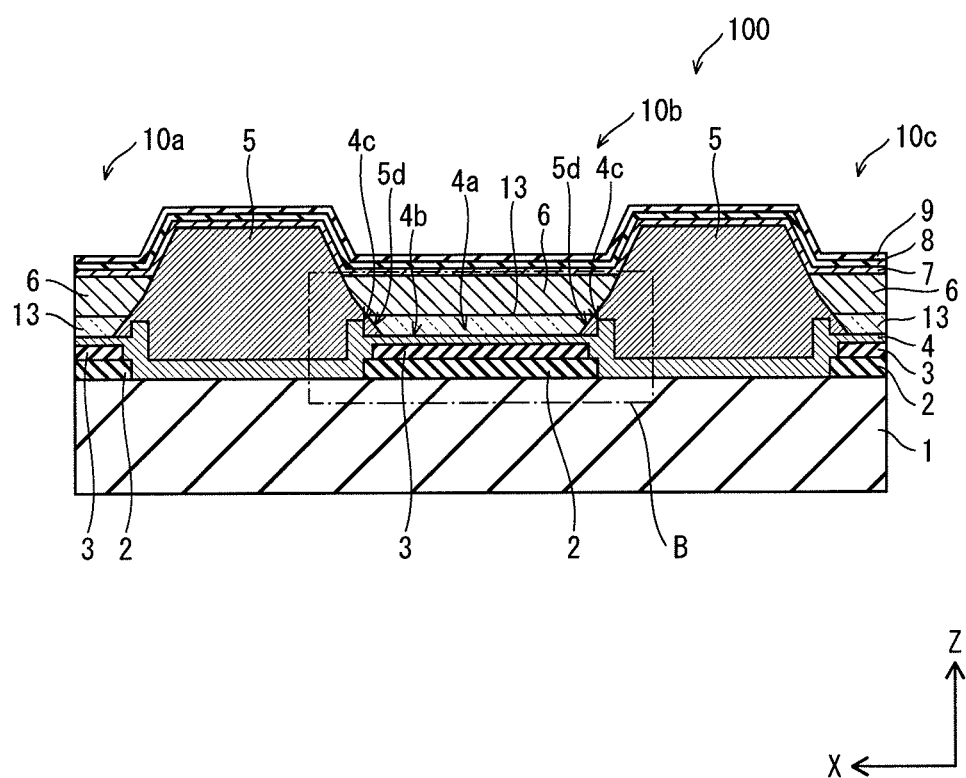
FIG. 27 is an end elevation showing a part of the organic EL display in Modification of the present invention.

Further, the charge injection transporting layer may include only the hole injection layer, and the hole injection layer and the hole transporting layer constituting the functional layer may be interposed between the anode and the light-emitting layer. In specific, the hole injection layer and the hole transporting layer may be formed as shown in a portion B of FIG. 27. That is, when the upper peripheral edge 4c of the recess 4a formed in the hole injection layer 4 is covered with the covering part 5d of the bank 5, a hole transporting layer 13 may be formed on the recess 4a of the hole injection layer 4 by applying ink including hole transporting material, and a light-emitting layer 6 may be formed on the hole transporting layer 13 by applying ink including light-emitting material.

In addition, the thickness of the hole transporting layer is 10 nm to 20 nm, and the hole transporting layer transports, to the organic light-emitting layer, holes injected from the hole injection layer. The hole transporting layer is made of hole transporting organic material. The hole transporting organic material transports generated holes by using intermolecular charge transfer reaction. This material is also referred to as p-type organic semiconductor material.

The hole transporting layer may be made of high-polymer material or low-molecular material, and the hole transporting layer is formed by wet printing. It is preferable that the hole transporting layer include a cross-linking agent so that the hole transporting layer is unlikely to be dissolved in the organic light-emitting layer when the organic light-emitting layer is formed on the hole transporting layer. Examples of the hole transporting organic material may include copolymer including fluorine units and triarylamine units, and low-molecular-weight triarylamine derivative. Examples of a cross-linking agent may include dipentaerythritol hexaacrylate and the like. In this case, it is preferable that the agent be made of doped polystyrene sulfonic acid, i.e., poly (3,4-ethylenedioxythiophene) (PEDOT-PSS) or its derivative (such as copolymers).

(6) In the above embodiment, since the anode 2 is formed from the thin Ag film, the ITO layer 3 is formed on the anode 2. When the anode 2 is formed from an Al-based material, it is possible to adopt a single layer structure of the anode without forming the ITO layer 3.

(7) In the above embodiment, although the organic EL display is taken as an example of the light-emitting device having a plurality of light-emitting elements, the present invention is not limited to this. The present invention may be applied to a luminaire and the like.

Figure 26:
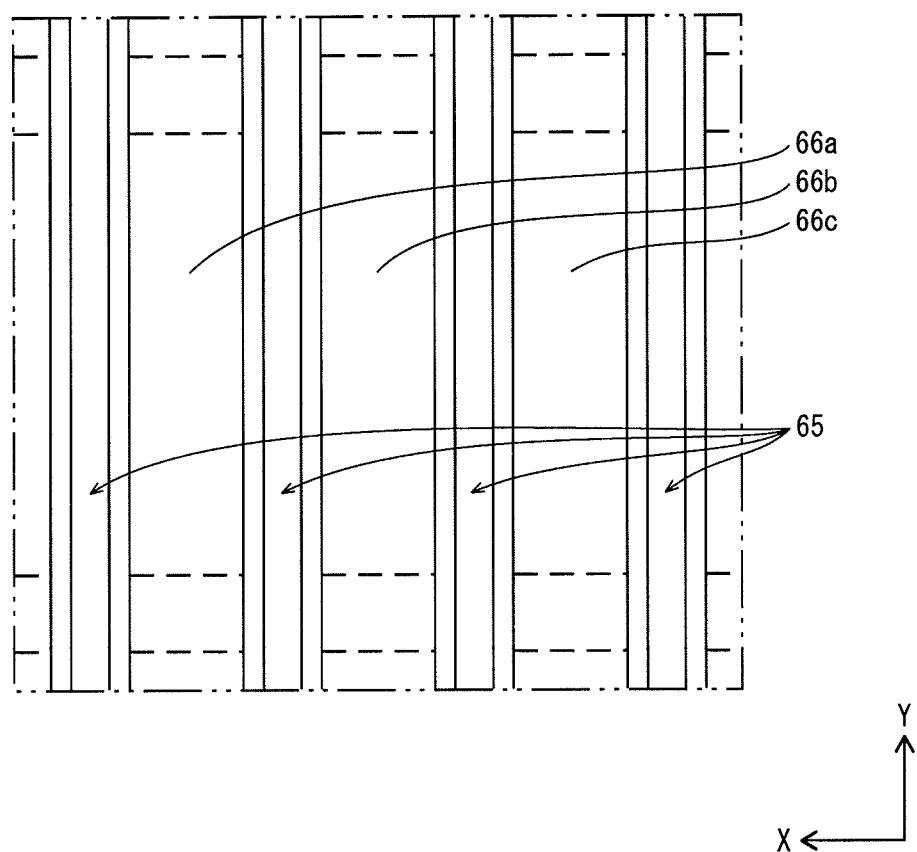
FIG. 26 is a plan view showing a part of the organic EL display in Modification of the present invention.

(8) In the above embodiment, although the so-called pixel bank (a bank having a lattice shape) is adopted, the present invention is not limited to this. For example, a line bank (banks arranged in lines) may be adopted. In an example of FIG. 26, a line bank 65 is adopted. The line bank 65 delimits consecutive light-emitting layers 6B6a, 66b, and 66c arranged along the X axis. Note that when the line bank 65 is adopted as shown in FIG. 26, adjacent light-emitting layers arranged along the Y axis are not defined by the bank element. However, by appropriately determining a driving method, a size of the anode, an interval between the anodes and so on, the adjacent light-emitting layers emit light without influencing each other.

(9) In the above embodiment, although a top-emission type light-emitting element is adopted, the light-emitting element of the present invention is not limited to the top-emission type light-emitting element. A bottom-emission type light-emitting element may be adopted.

(10) In the above embodiment, although only the electron injection layer is interposed between the light-emitting layer and the cathode, the electron transport layer may be interposed in addition to the electron injection layer.

(11) In the above embodiment, although organic material is used as a bank material, inorganic material may also be used.

In this case, the bank material layer may be formed by application or the like, in the same way as when organic material is used. The portion of the bank material layer may be removed by forming a resist pattern on the bank material layer, and then performing etching with use of predetermined etchant (Tetramethylammonium hydroxide (TMAH) solution, etc.). The resist pattern is removed by an aqueous or non-aqueous release agent after the etching, for example. Next, residues remaining after the etching are removed by being washed with pure water. Here, WOx or MoxWyOz, which is a material for the thin film, is soluble in pure water. Therefore, as is the case with FIG. 21A, an exposed portion of the thin film is eroded, and a recess is formed. As a result, the hole injection layer having the recess is formed. Hence, the present invention can be applied to banks made of inorganic material, in the same way as when banks made of organic material.

<Other Considerations>

The expression "occupied energy level" as referred to in the present specification includes an energy level of a so-called semi-occupied orbital, which is an electron orbital which is occupied by at least one electron.

Further, the implementation of the organic EL element of the present invention is not limited to a structure where the organic EL element is used in an independent state. A plurality of the organic EL elements of the present invention may be integrated on a substrate as pixels to form an organic EL panel. An organic EL display so yielded may be implemented by appropriately arranging the thickness of each of the layers in each of the organic EL elements.

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from high to low, and which can be driven at a low voltage. Especially, the high luminescence renders the present invention applicable as a light source and the like. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST

1 TFT substrate
2 anode
3 ITO (indium tin oxide) layer
4 hole injection layer (tungsten oxide) layer
4a recess
4b bottom of recess
4c upper peripheral edge of recess
4d inner side surface of recess
4e part of upper surface of hole injection layer in which recess is not formed
5 bank
5a, 5b bottom surface
5c level of bottom surface of bank
5d covering part
6A buffer layer
6B light-emitting layer
7 electron injection layer
8 cathode
8A barium layer
8B aluminum layer
9 passivation layer
10 substrate
10a, 10b, 10c organic EL element
11 thin film
12 bank material layer
13 hole transporting layer
55 pixel bank
55a bank element
55b bank element
56a1, 56a2, 56b1, 56b2, 56c1, 56c2 light-emitting layer
65 line bank
66a, 66b, 66c light-emitting layer
70 conductive silicon substrate
80 tungsten oxide layer
100 organic EL display
1000 organic EL element 1000A sample device for photoelectron spectroscopy measurement
1000B hole-only device

The invention claimed is:
1. An organic electroluminescent (EL) element, comprising:
an anode;
a cathode;
a functional layer disposed between the anode and the cathode, and including a light-emitting layer containing an organic material;
a hole injection layer disposed between the anode and the functional layer; and
a bank that defines an area in which the light-emitting layer is to be formed, wherein
the hole injection layer includes tungsten oxide and includes an occupied energy level that is approximately 1.8 electron volts to approximately 3.6 electron volts lower than a lowest energy level of a valence band of the hole injection layer in terms of a binding energy,
the hole injection layer has a recess in an upper surface of the area defined by the bank, and
an upper peripheral edge of the recess is covered with a part of the bank,
one of an ultraviolet photoelectron spectroscopy and an X-ray photoelectron spectroscopy of the hole injection layer, using a He I line as a light source and a normal line direction of a surface of the substrate as an electron emission angle, exhibits an upward protrusion that is 1.8 electron volts to 3.6 electron volts lower than a lowest energy level of a valence band of the hole injection layer in terms of binding energy, the upward protrusion corresponding to the occupied energy level of the hole injection layer.
2. The organic EL element of claim 1, wherein
the occupied energy level at an interface between the hole injection layer and the functional layer is approximately equal to an energy level of a highest occupied molecular orbital of the functional layer in terms of the binding energy.
3. The organic EL element of claim 1, wherein
a gap between the occupied energy level at an interface between the hole injection layer and the functional layer and an energy level of a highest occupied molecular orbital of the functional layer is at most approximately 0.3 electron volts in terms of the binding energy.
4. The organic EL element of claim 1, wherein
the ultraviolet photoelectron spectroscopy spectrum of the hole injection layer exhibits the upward protrusion that is approximately 1.8 electron volts to approximately 3.6 electron volts lower than the lowest energy level of the valence band in terms of the binding energy.
5. The organic EL element of claim 1, wherein
the X-ray photoelectron spectroscopy spectrum of the hole injection layer exhibits the upward protrusion that is approximately 1.8 electron volts to approximately 3.6 electron volts lower than the lowest energy level of the valence band in terms of the binding energy.
6. The organic EL element of claim 1, wherein
a differential spectrum obtained by differentiating an ultraviolet photoelectron spectroscopy spectrum of the hole injection layer has a shape that is expressed by a non-exponential function throughout a range between approximately 2.0 electron volts and approximately 3.2 electron volts lower than the lowest energy level of the valence band in terms of the binding energy.

7. The organic EL element of claim 1, wherein
the functional layer comprises an amine-containing material.
8. The organic EL element of claim 1, wherein
the functional layer includes at least one of a hole transfer layer that transfers the holes, and a buffer layer that one of adjusts optical characteristics of the organic light-emitting element and blocks electrons.
9. The organic EL element of claim 1, wherein
the occupied energy level is approximately 2.0 electron volts to 3.2 electron volts lower than the lowest energy level of the valence band in terms of the binding energy.
10. The organic EL element of claim 1, wherein
the part of the bank reaches a bottom of the recess, and a side surface of the bank slopes upward from the bottom of the recess to a top of the bank.
11. The organic EL element of claim 1, wherein
the part of the bank is out of contact with a bottom of the recess.
12. The organic EL element of claim 1, wherein
the hole injection layer extends laterally along a bottom surface of the bank.
13. The organic EL element of claim 1, wherein
the upper peripheral edge of the recess comprises a convex portion composed of (i) a part of the upper surface of the hole injection layer in which the recess is not formed and (ii) the inner side surface of the recess.
14. The organic EL element of claim 1, wherein
the bank is liquid-repellent and the hole injection layer is liquid-philic.
15. A display device comprising the organic EL element of claim 1.
16. A manufacturing method for an organic EL element, comprising:
preparing an anode;
forming a tungsten oxide layer above the anode by introducing a gas comprising an argon gas and an oxygen gas to a chamber of a sputtering device, a total pressure of the gas in the chamber being greater than approximately 2.7 pascals and at most equal to approximately 7.0 pascals, a partial pressure ratio of the oxygen gas with respect to the total pressure of the gas in the chamber being at least approximately 50% and at most approximately 70%, and an input power density per unit surface area of a sputtering target being at least approximately 1 W/cm$^2$ and at most approximately 2.8 W/cm$^2$;
forming a bank material layer containing material constituting a bank above the tungsten oxide layer;
forming a recess by removing a portion of the bank material layer so that the tungsten oxide layer is partially exposed and an upper surface of the tungsten oxide layer in the recess is closer to the anode than an upper peripheral edge of the recess, the recess having an inner bottom surface and an inner side surface that is continuous with the inner bottom surface;
heat-treating a remaining portion of the bank material layer, the remaining portion of the bank material layer being made fluid so that the bank material layer extends to cover the upper peripheral edge of the recess,
forming functional layers including a light-emitting layer above an exposed surface of the tungsten oxide layer after the heat treatment; and
forming a cathode above the functional layer.
17. The manufacturing method of claim 16, wherein
an ultraviolet photoelectron spectroscopy spectrum of the tungsten oxide layer exhibits an upward protrusion that is approximately 1.8 electron volts to approximately 3.6 electron volts lower than a lowest energy level of a valence band of the tungsten oxide layer in terms of a binding energy.

18. The manufacturing method of claim 16, wherein a differential spectrum obtained by differentiating an ultraviolet photoelectron spectroscopy spectrum of the tungsten oxide layer has a shape that is expressed by a non-exponential function throughout a range between approximately 2.0 electron volts and approximately 3.2 electron volts lower than the lowest energy level of the valence band in terms of the binding energy.

19. The organic EL element of claim 1, wherein the upper peripheral edge of the recess comprises at least a portion of an inner side surface of the recess.

20. The organic EL element of claim 1, wherein the recess extends under a bottom surface of the bank.

* * * * *